(12) United States Patent
Singh et al.

(10) Patent No.: US 12,191,196 B2
(45) Date of Patent: Jan. 7, 2025

(54) METHOD OF MANUFACTURING A METAL-OXIDE-SEMICONDUCTOR FIELD-EFFECT TRANSISTOR (MOSFET) HAVING LOW OFF-STATE CAPACITANCE

(71) Applicant: Taiwan Semiconductor Manufacturing Company, Ltd., Hsinchu (TW)

(72) Inventors: Gulbagh Singh, Tainan (TW); Tsung-Han Tsai, Miaoli (TW); Shih-Lu Hsu, Tainan (TW); Kun-Tsang Chuang, Miaoli (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 111 days.

(21) Appl. No.: 17/815,274

(22) Filed: Jul. 27, 2022

(65) Prior Publication Data

US 2022/0367242 A1    Nov. 17, 2022

Related U.S. Application Data

(62) Division of application No. 17/248,079, filed on Jan. 7, 2021, now Pat. No. 11,476,157.

(51) Int. Cl.
*H01L 21/768* (2006.01)
*H01L 21/285* (2006.01)
(Continued)

(52) U.S. Cl.
CPC .... *H01L 21/7682* (2013.01); *H01L 21/28518* (2013.01); *H01L 21/76805* (2013.01);
(Continued)

(58) Field of Classification Search
CPC .......... H01L 21/7682; H01L 21/28518; H01L 21/76805; H01L 21/76895; H01L 21/84;
(Continued)

(56) References Cited

U.S. PATENT DOCUMENTS 6,127,712 A    10/2000  Wu
8,188,552 B2    5/2012  Huang
(Continued)

FOREIGN PATENT DOCUMENTS

TW    201010060 A    3/2010
TW    201926471 A    7/2019

OTHER PUBLICATIONS

Co-pending U.S. Appl. No. 17/248,079, inventor Singh; Gulbagh, filed on Jan. 7, 2021.

*Primary Examiner* — Britt D Hanley
*Assistant Examiner* — Vicki B. Booker
(74) *Attorney, Agent, or Firm* — Harrity & Harrity, LLP

(57) ABSTRACT

A semiconductor device may include a source on a first side of a gate. The semiconductor device may include a drain on a second side of the gate, where the second side of the gate is opposite to the first side of the gate. The semiconductor device may include a first contact over the source. The semiconductor device may include a second contact over the drain. The semiconductor device may include an air gap over the gate between at least the first contact and the second contact. The semiconductor device may include at least two dielectric materials in each of a region between the air gap and the first contact and a region between the air gap and the second contact.

20 Claims, 28 Drawing Sheets

(51) Int. Cl.
  *H01L 23/532* (2006.01)
  *H01L 23/535* (2006.01)
  *H01L 29/45* (2006.01)
  *H01L 29/78* (2006.01)

(52) U.S. Cl.
  CPC .... *H01L 21/76895* (2013.01); *H01L 23/5329* (2013.01); *H01L 23/535* (2013.01); *H01L 29/45* (2013.01); *H01L 29/78* (2013.01)

(58) Field of Classification Search
  CPC ............ H01L 21/764; H01L 21/76897; H01L 23/5329; H01L 23/535; H01L 23/5222; H01L 23/53295; H01L 23/5386; H01L 29/45; H01L 29/78; H01L 29/665; H01L 29/0649; H01L 29/66477; H01L 29/66568; H01L 27/1203
  See application file for complete search history.

(56) References Cited

U.S. PATENT DOCUMENTS

| | | |
|---|---|---|
| 8,232,618 B2 | 7/2012 | Breyta et al. |
| 10,128,156 B1 | 11/2018 | Chiang et al. |
| 10,529,826 B1* | 1/2020 | Frougier ............. H01L 29/6656 |
| 10,707,120 B1* | 7/2020 | Yami ................. H01L 21/76224 |
| 2008/0020570 A1 | 1/2008 | Naik |
| 2019/0157414 A1* | 5/2019 | Ando ................. H01L 21/02603 |
| 2019/0378765 A1* | 12/2019 | Xie ................. H01L 21/823885 |
| 2020/0066866 A1 | 2/2020 | Cheng |
| 2020/0388694 A1 | 12/2020 | Cheng et al. |
| 2021/0242110 A1* | 8/2021 | Hsu ..................... H01L 23/5222 |
| 2021/0327813 A1* | 10/2021 | Singh ................ H01L 21/76802 |

* cited by examiner

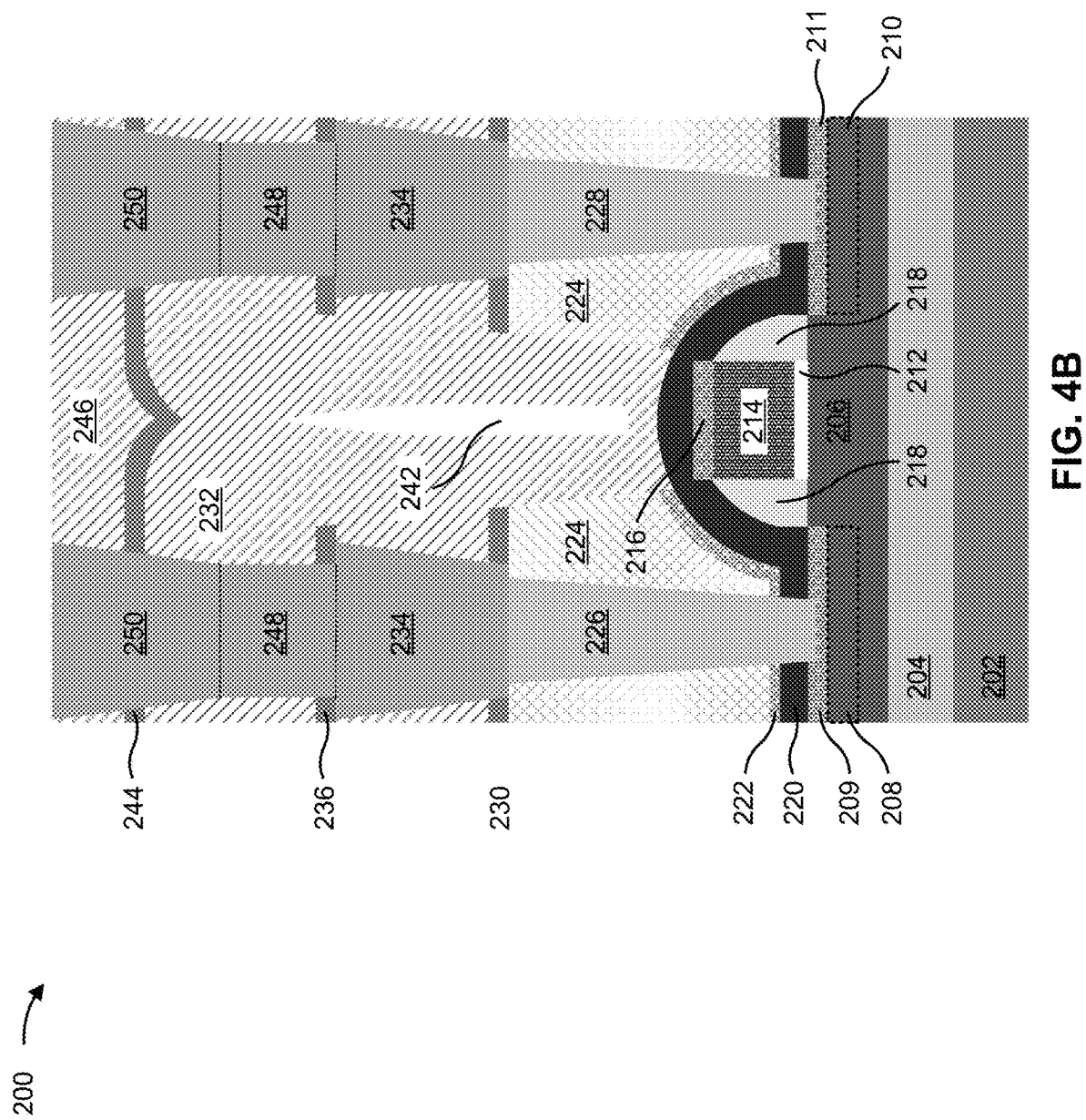

METHOD OF MANUFACTURING A METAL-OXIDE-SEMICONDUCTOR FIELD-EFFECT TRANSISTOR (MOSFET) HAVING LOW OFF-STATE CAPACITANCE

RELATED APPLICATION

This application is a divisional of U.S. patent application Ser. No. 17/248,079, filed Jan. 7, 2021, which is incorporated herein by reference in its entirety.

BACKGROUND

A field-effect transistor (FET) is a type of transistor that uses an electric field to control the flow of current. A FET includes three terminals: a source, a gate, and a drain. In operation, a FET controls the flow of current through the application of a voltage to the gate which, in turn, alters conductivity between the drain and the source. A commonly used type of FET is a metal-oxide-semiconductor field-effect transistor (MOSFET). A MOSFET can be used, for example, as a switch for an electrical signal (e.g., a radio frequency (RF) switch) or as an amplifier for an electrical signal (e.g., a low-noise amplifier (LNA)), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4E are diagrams of further example semiconductor devices described herein.

DETAILED DESCRIPTION

Figure 1:
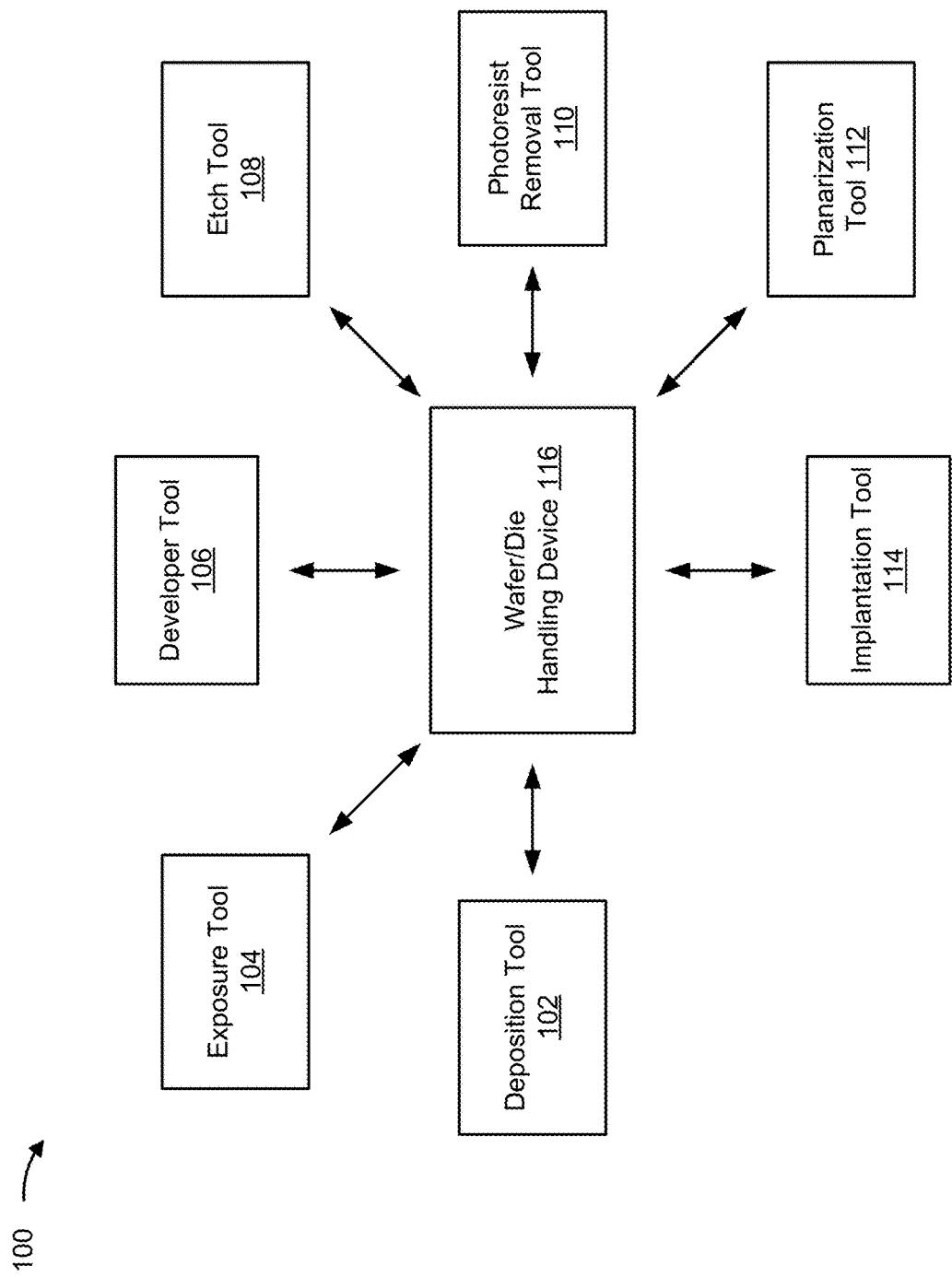
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some applications, such as an RF front-end module application, require a MOSFET to have a low off-state capacitance ($C_{off}$) value and/or a low on-resistance ($R_{on}$)× $C_{off}$ value in order for the MOSFET to provide desired switching performance and/or to provide an acceptable time delay of the MOSFET. Notably, in a typical MOSFET, a significant amount (e.g., at least 45%) of a $C_{off}$ value is attributable to backend-of-line (BEOL) capacitance. The BEOL capacitance includes capacitances associated with BEOL features of the MOSFET, such as capacitances between portions of one or more metal layers of the MOSFET, capacitances between portions of the one or more metal layers and a gate of the MOSFET, and capacitances between contacts of the MOSFET and the gate. These BEOL capacitances attribute to the overall $C_{off}$ value (and therefore the $R_{on} \times C_{off}$ value) of the MOSFET, meaning that resistive-capacitance (RC) delay and degradation of RF performance increases with BEOL capacitance.

Some implementations described herein provide a MOSFET with a $C_{off}$ value (and therefore an $R_{on} \times C_{off}$ value) that enables desired switching performance and/or a desired time delay (e.g., sufficient for an RF front-end module application). In some implementations, the $C_{off}$ value is provided by reducing off-state capacitance of BEOL features of the MOSFET. In some implementations, the reduction in the BEOL $C_{off}$ value is provided by reducing a dielectric constant in regions between the BEOL features of the MOSFET (e.g., to reduce capacitances associated with the BEOL features). In some implementations, the lowering of the dielectric constant is achieved by an air gap formed between contacts of the MOSFET and/or between portions of one or more metal layers of the MOSFET. Additional details are provided below.

In some implementations, a $C_{off}$ value associated with the BEOL features can be reduced (e.g., by at least 30% as compared to a typical MOSFET), meaning that an overall $C_{off}$ value of the MOSFET can also be reduced (e.g., by at least 15%). Therefore, the $C_{off}$ value and the $R_{on} \times C_{off}$ value of the MOSFET are decreased, meaning that RC delay and RF performance achievable by the MOSFET may be sufficient for use in a given application. Further, when the MOSFET is used as an amplifier (e.g., an LNA), a gate-drain capacitance (Cgd) is reduced (e.g., by approximately 20%) and/or a drain-drain capacitance (Cdd) is reduced (e.g., by approximately 10%). Furthermore, a maximum gain, a frequency at which current gain is unity (Ft), and/or a frequency at which power gain is unity (Fmax) may be improved.

FIG. 1 is a diagram of an example environment 100 in which systems and/or methods described herein may be implemented. As shown in FIG. 1, environment 100 may include a plurality of semiconductor processing tools 102-114 and a wafer/die handling device 116. The plurality of semiconductor processing tools 102-114 may include a deposition tool 102, an exposure tool 104, a developer tool 106, an etch tool 108, a photoresist removal tool 110, a planarization tool 112, an implantation tool 114, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 may deposit a metal material to form one or more conductors or conductive layers, may deposit an insulating material to form a dielectric or insulating layer, and/or the like as described herein. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The photoresist removal tool 110 is a semiconductor processing tool that is capable of removing a portion of a photoresist layer deposited on a substrate. For example, the photoresist removal tool 110 may remove one or more portions of the photoresist layer (e.g., using a chemical stripper and/or another technique) after the etch tool 108 uses the photoresist layer to etch the substrate.

The planarization tool 112 is a semiconductor processing tool that is capable of polishing or planarizing various layers of a wafer or semiconductor device. For example, a polishing device may include a chemical mechanical polishing (CMP) device and/or another type of polishing device. In some implementations, the polishing device may polish or planarize a layer of deposited or plated material. A CMP process may include depositing a slurry (or polishing compound) onto a polishing pad. A wafer may be mounted to a carrier, which may rotate the wafer as the wafer is pressed against the polishing pad. The slurry and polishing pad act as an abrasive that polishes or planarizes one or more layers of the wafer as the wafer is rotated. The polishing pad may also be rotated to ensure a continuous supply of slurry is applied to the polishing pad.

The implantation tool 114 is a semiconductor processing tool that is used to implant ions into a substrate of a semiconductor wafer. In some implementations, the implantation tool 114 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. In some implementations, the implantation tool 114 can be used to form a SPAD in a substrate, as described herein.

Wafer/die handling device 116 includes a mobile robot, a robot arm, a tram or rail car, and/or another type of device that are used to handle wafers and/or dies and/or transport wafers and/or dies between semiconductor processing tools 102-114 and/or to and from other locations such as a wafer rack, a storage room, and/or the like. In some implementations, wafer/die handling device 116 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
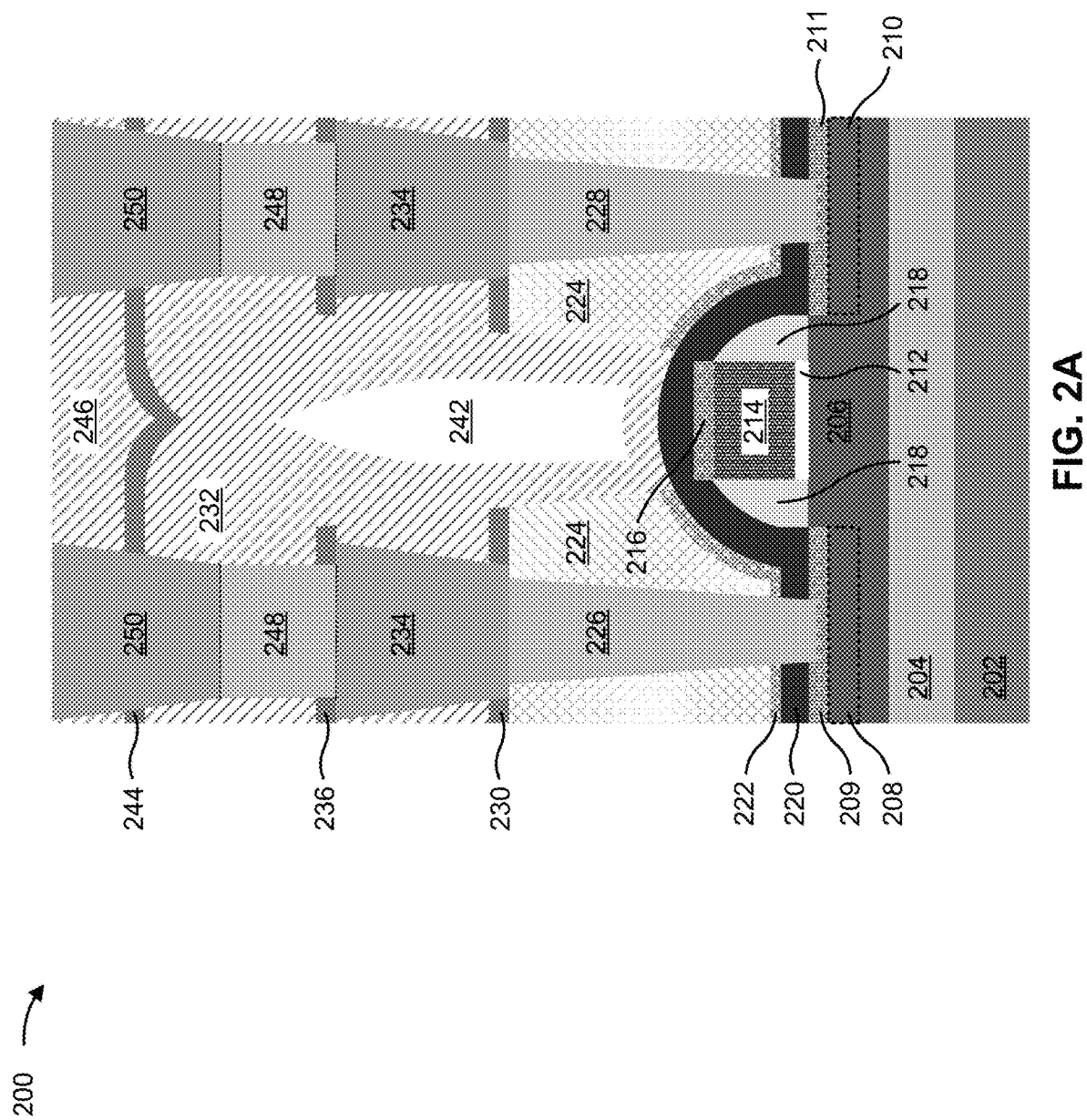
FIGS. 2A-2C are diagrams associated with an example semiconductor device described herein.
Figure 2B:
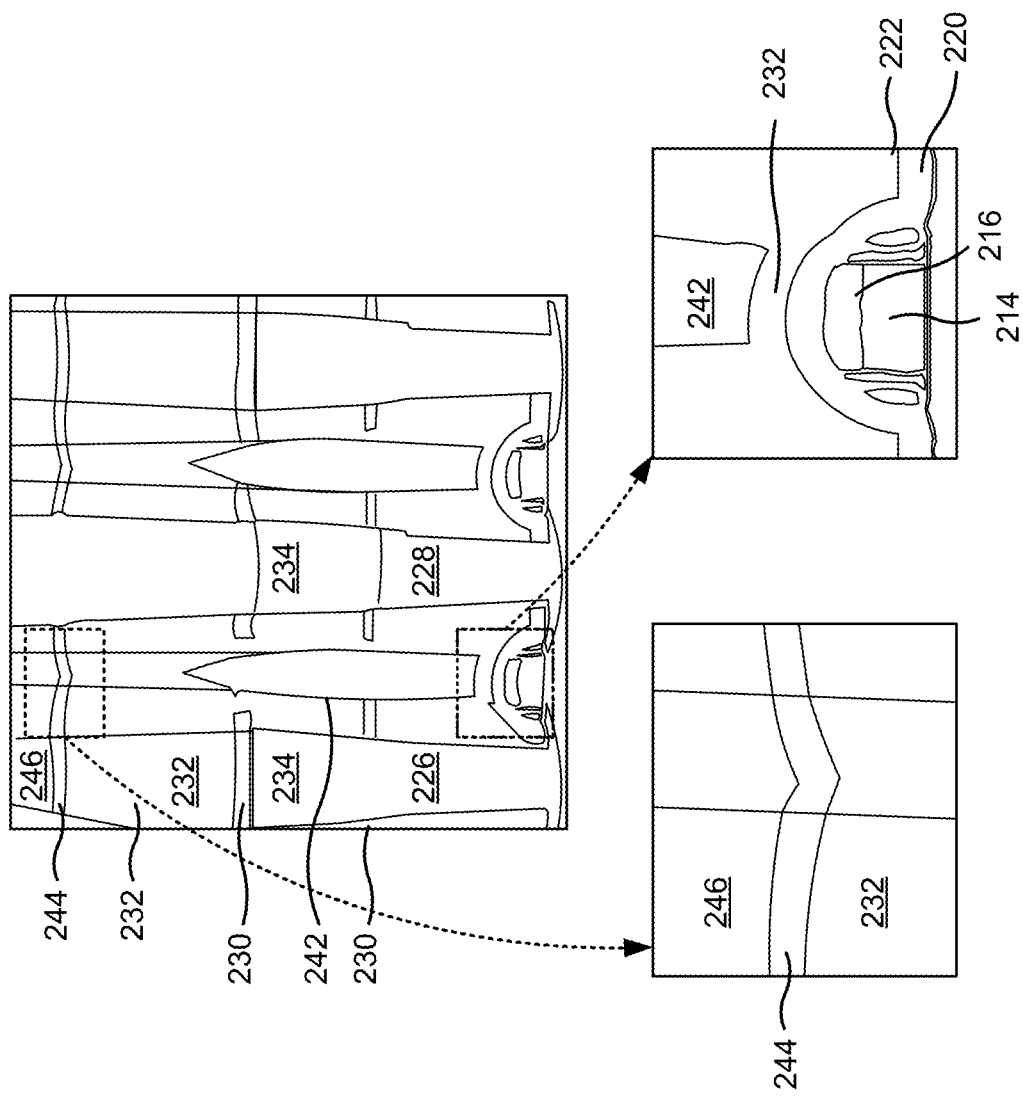
Figure 2C:
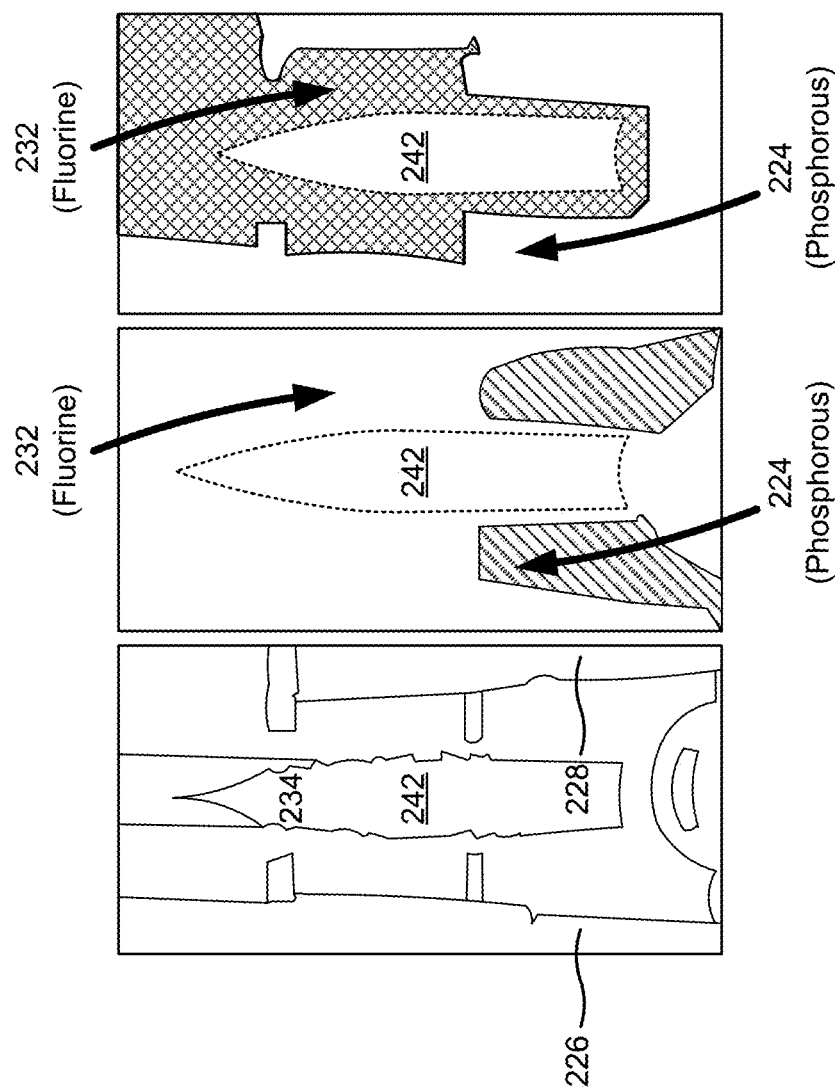

FIGS. 2A-2C are diagrams associated with an example semiconductor device 200 described herein. As shown in FIG. 2A, the semiconductor device 200 may include a substrate 202, a buried oxide (BOX) layer 204, an active region 206, a source 208, a source silicide 209, a drain 210, a drain silicide 211, a gate dielectric 212, a gate 214, a gate silicide 216, a set of spacers 218, a contact etch stop layer 220, a dielectric film 222, a first dielectric material 224, a first contact 226, a second contact 228, a first dielectric layer 230, a second dielectric material 232, a first metal layer 234, a second dielectric layer 236, an air gap 242, a third dielectric layer 244, a third dielectric material 246, a set of vias 248, and a second metal layer 250.

The semiconductor device 200 may include, for example, a MOSFET, a fin FET (FinFET), or another type of semiconductor device with a gate. The substrate 202 may include a semiconductor die substrate, a semiconductor wafer, or another type of substrate in which a semiconductor device, such as a MOSFET, a FiNFET, or the like, may be formed. In some implementations, the substrate 202 is formed of silicon, a material including silicon, a III-V compound semiconductor material such as gallium arsenide (GaAs), a silicon on insulator (SOI), or another type of semiconductor material.

Various layers of the semiconductor device 200 form a MOSFET structure in the examples of semiconductor device 200 described herein. In the MOSFET structure of the semiconductor device 200, the active region 206, the source 208, and the drain 210 are over the BOX layer 204 within substrate 202. Additionally, the gate dielectric 212 is over the active region 206, the gate 214 (e.g., a polysilicon gate) is over the gate dielectric 212, and the spacers 218 (e.g., comprising an insulating material) surround the gate dielectric 212 and the gate 214. As further shown, the source silicide 209 is over the source 208 (e.g., to facilitate contact to the source 208), the drain silicide 211 is over the drain 210 (e.g., to facilitate contact to the drain 210), and the gate silicide 216 is over the gate 214 (e.g., to facilitate contact to the gate 214). Further, the contact etch stop layer 220 (e.g., a silicon nitride (SiN) layer) is over the gate 214 to protect lower layers of the semiconductor device 200 and/or indicate an etch endpoint associated with formation of the first contact 226 and the second contact 228. Notably, while the example implementations described herein illustrate the particular MOSFET structure shown in FIG. 2A, semiconductor device 200 may in practice include one or more other and/or different semiconductor layers and/or a different structure than shown in the semiconductor device 200, as described herein.

As shown in FIG. 2A, the source 208 is on a first side of the gate 214 (e.g., illustrated in semiconductor device 200 as the left side of the gate 214) and the drain 210 is on a second (opposite) side of the gate 214 (e.g., illustrated in semiconductor device 200 as the right side of the gate 214). The first contact 226 is over the source 208 to provide electrical contact to the source 208. Similarly, the second contact 228 is over the drain 210 to provide electrical contact to the drain 210. Notably, although not shown in the cross-section of FIG. 2A, one or more contacts may be formed over the gate 214 to provide electrical contact to the gate 214.

In some implementations, as shown in FIG. 2A, the semiconductor device 200 includes the dielectric film 222 over the contact etch stop layer 220. The dielectric film 222 may include, for example, a silicon oxynitride ($Si_xON_y$) film or another type of insulating material. In some implementations, the dielectric film 222 may comprise a material that is different from the first dielectric material 224. In some implementations, as illustrated in FIG. 2A, the dielectric film 222 has an opening below the air gap 242 (e.g., over the gate 214) such that the second dielectric material 232 is on the contact etch stop layer 220 below the air gap 242.

In some implementations, as shown in FIG. 2A, the semiconductor device 200 comprises the air gap 242 over the gate 214. In some implementations, the air gap 242 serves to lower the $C_{off}$ value of BEOL features of the semiconductor device 200, as described in further detail below. In some implementations, the air gap 242 may be between at least the first contact 226 and the second contact 228. For example, as shown in FIG. 2A, the air gap 242 may, in some implementations, be formed such that the air gap 242 is between a portion of the first contact 226 and a portion of the second contact 228, between portions of the first metal layer 234, and between portions of a pair of vias 248 (e.g., vias connecting the first metal layer 234 to the second metal layer 250).

In some implementations, a size of the air gap 242 nearer to a bottom of the air gap 242 (nearest to the gate 214) is larger than a size of the air gap 242 nearer to a top of the air gap 242 (furthest from the gate 214). For example, as illustrated in FIG. 2A, the air gap 242 may have a pointed feature at the top of the air gap 242. That is, in some implementations, the area of the air gap 242 nearer to the gate 214 may be larger than the area of the air gap 242 further from the gate 214. In some implementations, such a configuration of the air gap 242 improves the reduction in the BEOL of the semiconductor device 200, as described below. In some implementations, a shape of the air gap 242 at the bottom of the air gap 242 may conform with a shape of the contact etch stop layer 220. As shown, in some implementations, the air gap 242 is formed such that sidewalls of the air gap 242 are in a direction that is approximately parallel to sidewalls of the first contact 226 and/or the second contact 228. In some implementations, an area of a portion of the air gap 242 between the first contact 226 and the second contact 228 may be in a range from approximately 30% to approximately 70% of the total area between the first contact 226 and the second contact 228.

In some implementations, at least two dielectric materials are in a region between the air gap 242 and the first contact 226 and a region between the air gap 242 and the second contact 228. For example, as shown in FIG. 2A, the first dielectric material 224 and the second dielectric material 232 are in the region between the first contact 226 and the air gap 242. Similarly, the first dielectric material 224 and the second dielectric material 232 are in the region between the second contact 228 and the air gap 242. More generally, in some implementations, the first dielectric material 224 is between the first contact 226 and the second contact 228, where a first portion of the first dielectric material 224 is adjacent to the first contact 226 and a second portion of the first dielectric material 224 is adjacent to the second contact 228. Here, the second dielectric material 232 is present between the first portion of the first dielectric material 224 and the second portion of the first dielectric material 224, and some portion of the second dielectric material 232 is over the gate 214 (e.g., on the contact etch stop layer 220). In some implementations, such as that shown in FIG. 2A, the air gap 242 is between the first contact 226 and the second contact 228 and is within the second dielectric material 232. In some implementations, a portion of the second dielectric material 232 is between the air gap 242 and the contact etch stop layer 220. In some implementations, the second dielectric material 232 (and the air gap 242, if present) reduce a dielectric constant of the semiconductor device 200 by, in effect, replacing a portion of the first dielectric material 224. This reduction in the dielectric constant may reduce the $C_{off}$ value of the semiconductor device 200, as described below.

In some implementations, the first dielectric material 224 is an inter-layer dielectric (ILD) for providing isolation one or more regions of semiconductor device 200 and the second dielectric material 232 is an inter-metal dielectric (IMD) for providing isolation for metal layers of semiconductor device 200. In some implementations, a dielectric constant of the second dielectric material 232 is less than a dielectric constant of the first dielectric material 224. Thus, inclusion of the second dielectric material 232 (in place of a portion of the first dielectric material 224) may act to reduce the dielectric constant of the semiconductor device 200 and therefore reduce the $C_{off}$ of the semiconductor device 200. In some implementations, the first dielectric material 224 comprises phosphorous (e.g., the first dielectric material 224 may be dominant of phosphorous) and the second dielectric material 232 comprises fluorine (e.g., the second dielectric material 232 may be dominant of fluorine). In some implementations, the presence of the second dielectric material 232 between the first contact 226 and the second contact 228 (rather than only the first dielectric material 224 being present between the first contact 226 and the second contact 228) serves to lower the $C_{off}$ value of BEOL features of the semiconductor device 200, as described in further detail below.

In some implementations, semiconductor device 200 may include one or more metal layers over the first contact 226 and the second contact 228. For example, in the example shown in FIG. 2A, semiconductor device 200 includes the first metal layer 234 and the second metal layer 250, with the first metal layer 234 and the second metal layer 250 being connected by vias 248. In some implementations, the air gap 242 is present between portions of at least one metal layer of semiconductor device 200. For example, in FIG. 2A, the air gap 242 is present between a first portion of the first metal layer 234 over the first contact 226 and a second portion of the first metal layer 234 over the second contact 228. In some implementations, the presence of the air gap 242 between portions of the first metal layer 234 reduces the dielectric constant of the semiconductor device 200 (by, in effect, replacing a portion of the second dielectric material 232 with the air gap 242), thereby reducing the $C_{off}$ of the semiconductor device 200. In some implementations, as illustrated in FIG. 2A, an area of the air gap 242 between the first portion of the first metal layer 234 and the second portion of the first metal layer 234 is greater than an area of the air gap 242 between the first contact 226 and the second contact 228. That is, a portion of the air gap 242 between the first metal layer 234 and the second metal layer 250 may be larger than a portion of the air gap 242 between the first contact 226 and the second contact 228. In some implementations, an area of a portion of the air gap 242 between the portions of the first metal layer 234 may be in a range from approximately 40% to approximately 90% of the total area between the portions of the first metal layer 234. In some implementations, as further shown in FIG. 2A, the air gap 242 is present between at least a portion of the via 248 over the first contact 226 and a portion of the via 248 over the second contact 228.

Notably, semiconductor device 200 comprises the first metal layer 234 and the second metal layer 250, and the air gap 242 is between portions of the first metal layer 234 and is not between portions of the second metal layer 250. However, in some implementations, the air gap 242 may be formed such that the air gap 242 is between portions of the second metal layer 250 (e.g., in addition to or as an alternative to being between the portions of the first metal layer 234). Further, in some implementations, semiconductor device 200 may include a number of additional metal layers above the second metal layer 250, and the air gap 242 may (or may not) be between portions of any one or more of these additional metals layers.

In some implementations, semiconductor device 200 may include one or more dielectric layers. For example, semiconductor device 200 may include the first dielectric layer 230 (e.g., between the first dielectric material 224 and the second dielectric material 232 over the first contact 226 and the second contact 228), the second dielectric layer 236 (e.g., over the first metal layer 234), and the third dielectric layer 244 (e.g., over the second dielectric material 232). The first dielectric layer 230, the second dielectric layer 236, and/or the third dielectric layer 244 may include, for example, a silicon nitride (SiN) layer, a silicon carbide (SiC) layer, or another type of dielectric material. In some implementations, the semiconductor device 200 includes a third dielectric material 246 over the third dielectric layer 244. In some implementations, the third dielectric material 246 may be the same as or similar to the second dielectric material 232 (e.g., the third dielectric material 246 may be an AVID).

In some implementations, the air gap 242 is between portions of one or more dielectric layers of semiconductor device 200. For example, as shown in FIG. 2A, the air gap 242 may be between a portion of the first dielectric layer 230 that is on the first side of the gate 214 and a portion of the first dielectric layer 230 that is on the second side of the gate 214. Similarly, the air gap 242 may be between a portion of the second dielectric layer 236 that is on the first side of the gate 214 and a portion of the second dielectric layer 236 that is on the second side of the gate 214. Here, the dielectric layers 230/236 may have openings through which the air gap 242 extends. In some implementations, the openings serve to reduce a dielectric constant associated with the BEOL features of the semiconductor device 200 (e.g., since a dielectric constant of the dielectric layers 230/236 may be higher than that of the second dielectric material 232). Notably, in semiconductor device 200, the third dielectric layer 244 is over the air gap 242 (e.g., the third dielectric layer 244 does not have an opening through which the air gap 242 extends). In some implementations, as shown in FIG. 2A, the third dielectric layer 244 (i.e., the first dielectric layer above the air gap 242) has a pinched feature over the air gap 242.

Notably, semiconductor device 200 comprises the first dielectric layer 230, the second dielectric layer 236, and the third dielectric layer 244, and the air gap 242 is between portions of the first dielectric layer 230 and the second dielectric layer 236 but does not extend to the third dielectric layer 244. However, in some implementations, the air gap 242 may be formed such that the air gap 242 is between portions of the third dielectric layer 244 (e.g., in addition to or as an alternative to being between the portions of the first dielectric layer 230 and the second dielectric layer 236). Further, in some implementations, semiconductor device 200 may include a number of additional dielectric layers above the third dielectric layer 244 (e.g., when semiconductor device 200 includes additional metal layers), and the air gap 242 may (or may not) be between portions of any one or more of these additional dielectric layers.

In some implementations, the presence of the air gap 242 and/or the second dielectric material 232 between at least the first contact 226 and the second contact 228 serves to lower the $C_{off}$ value of BEOL features of the semiconductor device 200. For example, a dielectric constant of the second dielectric material 232 may be less than a dielectric constant of the first dielectric material 224, as described above. Further, a dielectric constant of air may be less than the dielectric constant of the second dielectric material 232. Thus, by including the air gap 242 and the second dielectric material 232 between the first contact 226 and the second contact 228 and (optionally) including the air gap 242 between the portions of at least the first metal layer 234, the dielectric constant between BEOL features of the semiconductor device 200 is reduced. This means that the $C_{off}$ value of the BEOL features is reduced, thereby lowering the overall $C_{off}$ value of the semiconductor device 200 (and therefore lowering the $R_{on} \times C_{off}$ value). In some implementations, the $C_{off}$ value associated with the BEOL features can be reduced (e.g., by at least 30% as compared to a typical MOSFET), meaning that an overall $C_{off}$ value of the MOSFET can also be reduced (e.g., by at least 15%).

FIGS. 2B and 2C are various images of an example semiconductor device 200 meant to illustrate examples of the features of semiconductor device 200 described above. For the purpose of clarity, not all layers of semiconductor device 200 are labeled in FIGS. 2B and 2C. The top image in FIG. 2B shows a cross-section of the semiconductor device 200 comprising the air gap 242 between the first contact 226 and the second contact 228 and between portions of the first metal layer 234. The lower left image in FIG. 2B is a zoomed-in view of the pinched feature in the third dielectric layer 244 over the air gap 242 (e.g., between the second dielectric material 232 and the third dielectric material 246). The lower right image in FIG. 2B is a zoomed-in view of the gate 214 illustrating the presence of the second dielectric material 232 between the air gap 242 and the gate 214 and the opening in the dielectric film 222 below the air gap 242 (e.g., over the gate 214).

FIG. 2C includes a series of images illustrating the arrangement of the first dielectric material 224 and the second dielectric material 232 in the semiconductor device 200. The left image of FIG. 2C shows a cross-section of the semiconductor device 200 comprising the air gap 242 between the first contact 226 and the second contact 228 and between portions of the first metal layer 234. The center image of FIG. 2C highlights areas of the semiconductor device 200 in which the first dielectric material 224 (e.g., comprising phosphorous) is present, and the right image of FIG. 2C highlights areas of the semiconductor device 200 in which the second dielectric material 232 (e.g., comprising fluorine) is present. As shown in FIG. 2C, and as described above, the first dielectric material 224 and the second dielectric material 232 are in each of the region between the first contact 226 and the air gap 242 and the region between the second contact 228 and the air gap 242.

In some implementations, the semiconductor device 200 may be included on the same chip as one or more other semiconductor devices. In such a case, any of the one or more other semiconductor devices may include the air gap 242 similar to that of semiconductor device 200, may not include the air gap 242, or may have a differently formed air gap 242. For example, the semiconductor device 200 may be an RF switching device, and may be on a chip that includes a non-RF switching device (e.g., having a different contact height than that of the semiconductor device 200). Here, the non-RF switching device may not have the air gap 242, or the air gap 242 in the non-RF switching device may be differently formed as compared to the air gap 242 in the semiconductor device 200. As a particular example, the air gap 242 in the non-RF switching device may be between portions of the first metal layer 234 and not between contacts of the non-RF switching device.

The number and arrangement of structures, layers, or the like shown in FIGS. 2A-2C are provided as examples. In practice, a semiconductor device may include additional structures and/or layers; fewer structures and/or layers; different structures and/or layers; and/or differently arranged structures and/or layers than those shown in FIGS. 2A-2C. That is, as indicated above, FIGS. 2A-2C are provided as an example, and other examples may differ from what is described with regard to FIGS. 2A-2C. As a particular example, while semiconductor device 200 is described as including the first dielectric material 224 and the second dielectric material 232 in the region around the air gap 242, the semiconductor device 200 may include one or more additional dielectric materials in the region around the air gap 242.

Figure 3A:
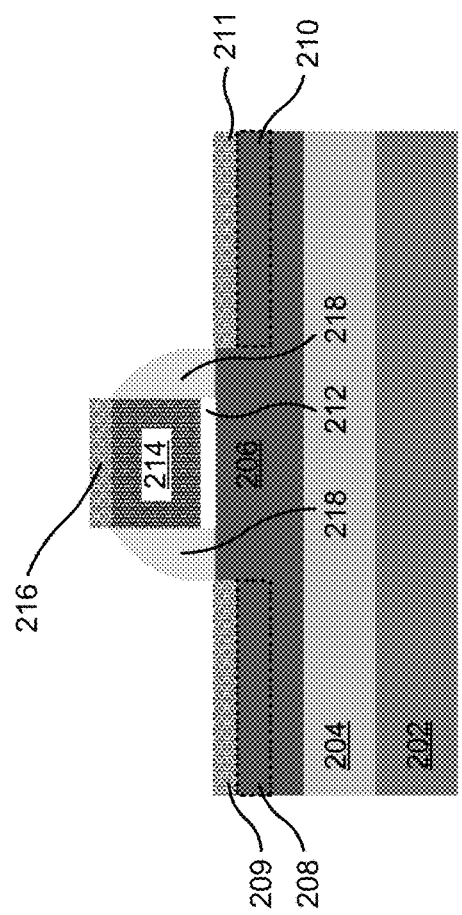
FIGS. 3A-3Q are diagrams of an example of forming a semiconductor device described herein.
Figure 3B:
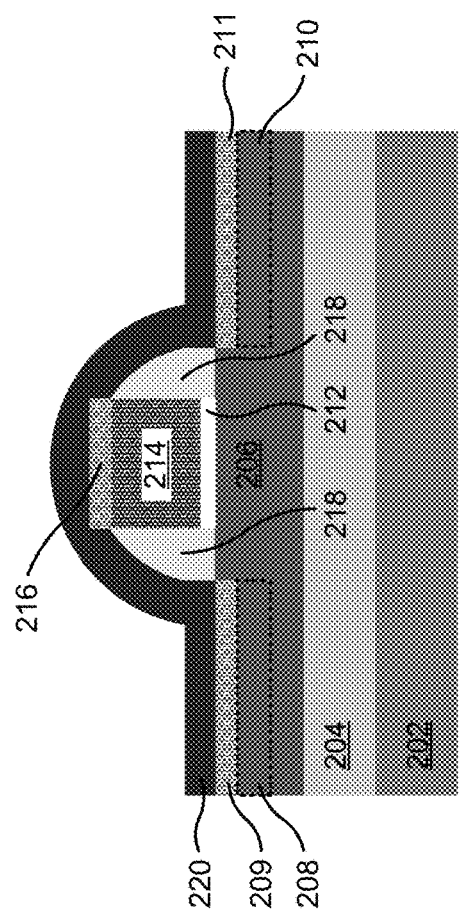
Figure 3C:
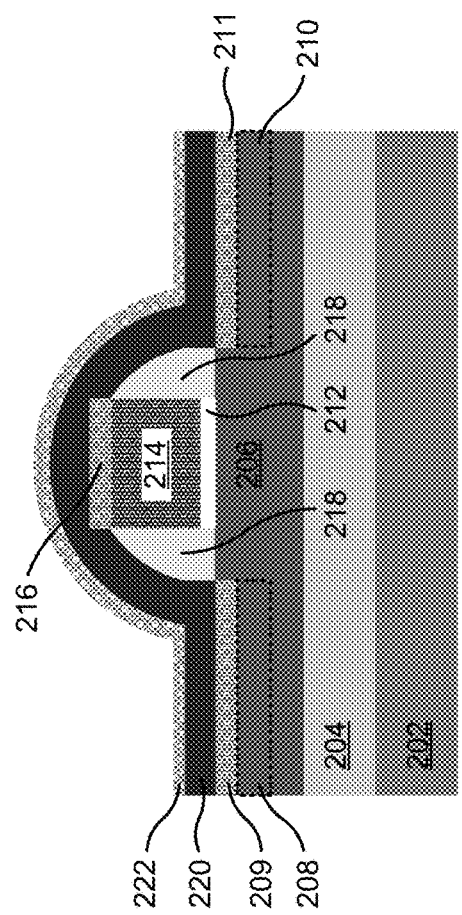
Figure 3D:
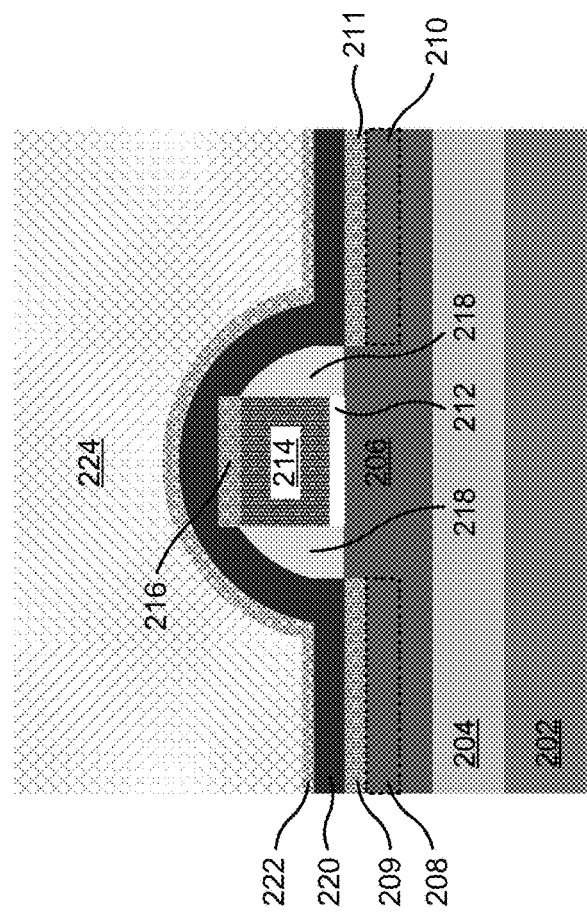
Figure 3E:
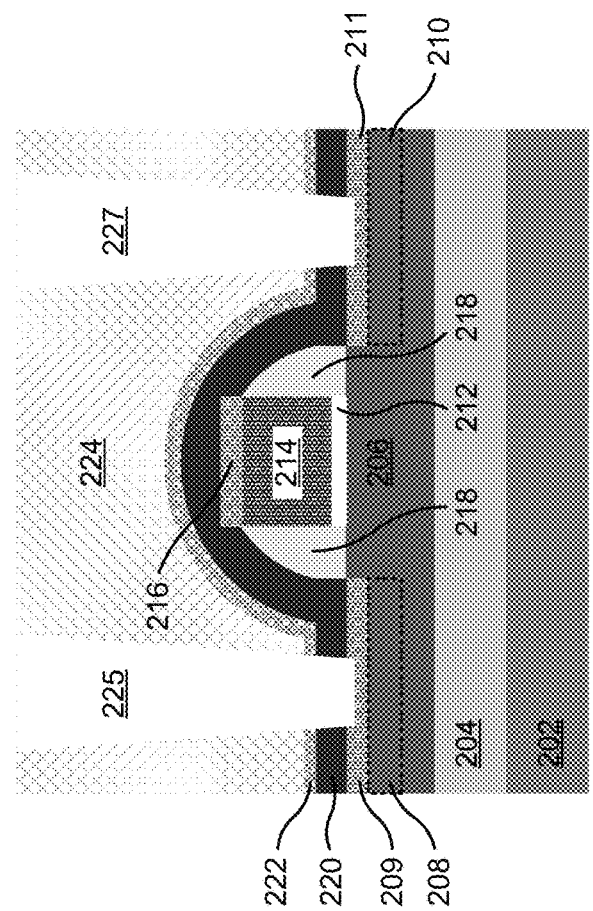
Figure 3F:
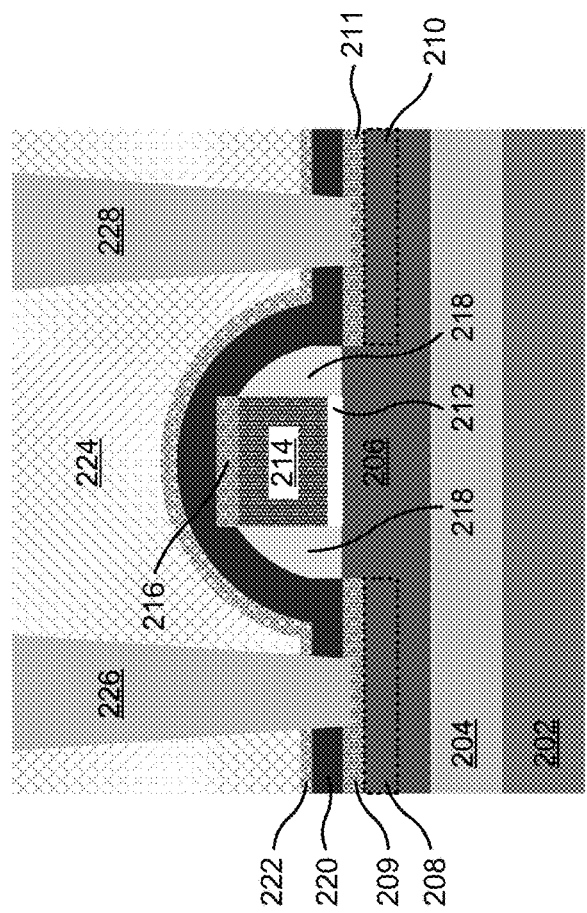
Figure 3G:
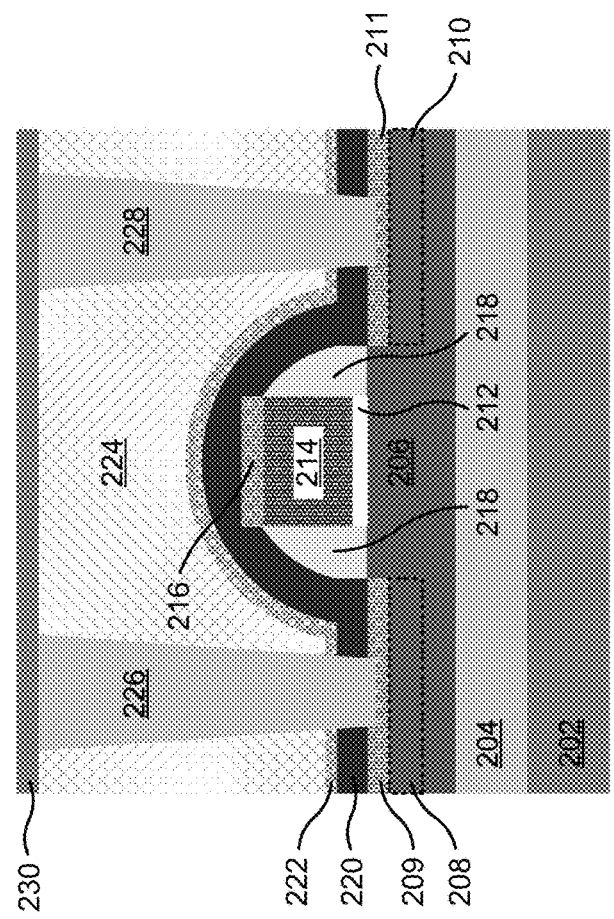
Figure 3H:
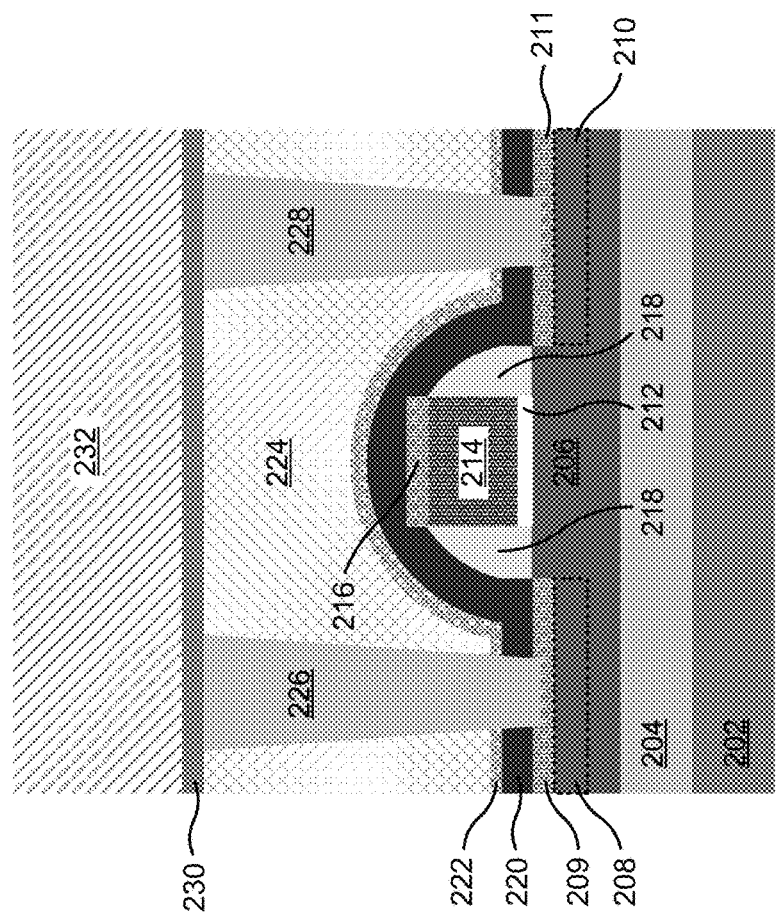
Figure 3I:
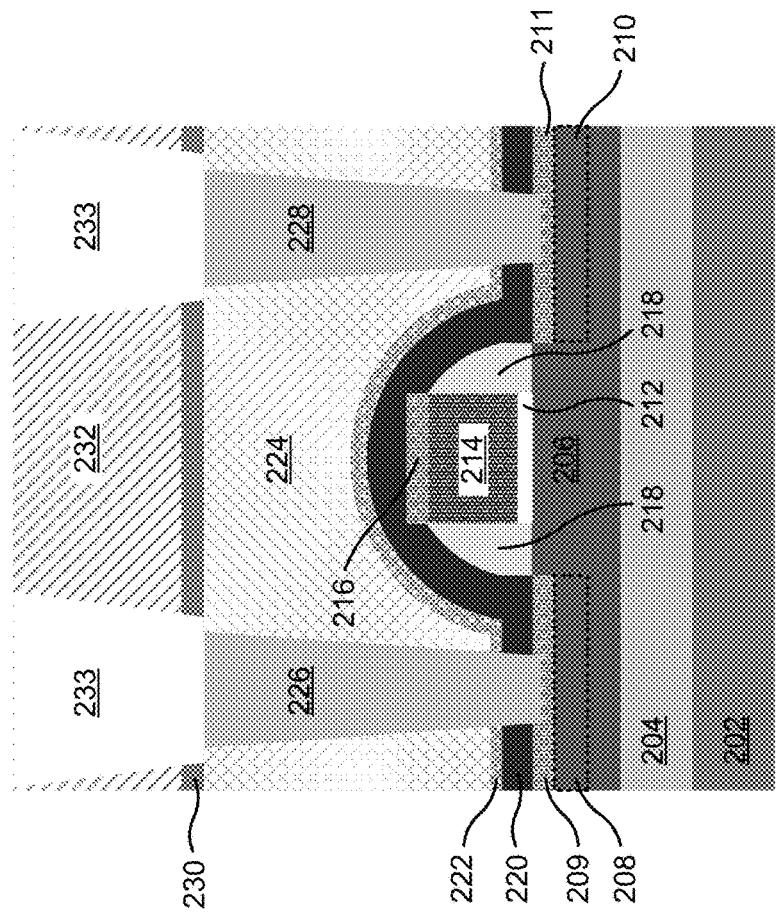
Figure 3J:
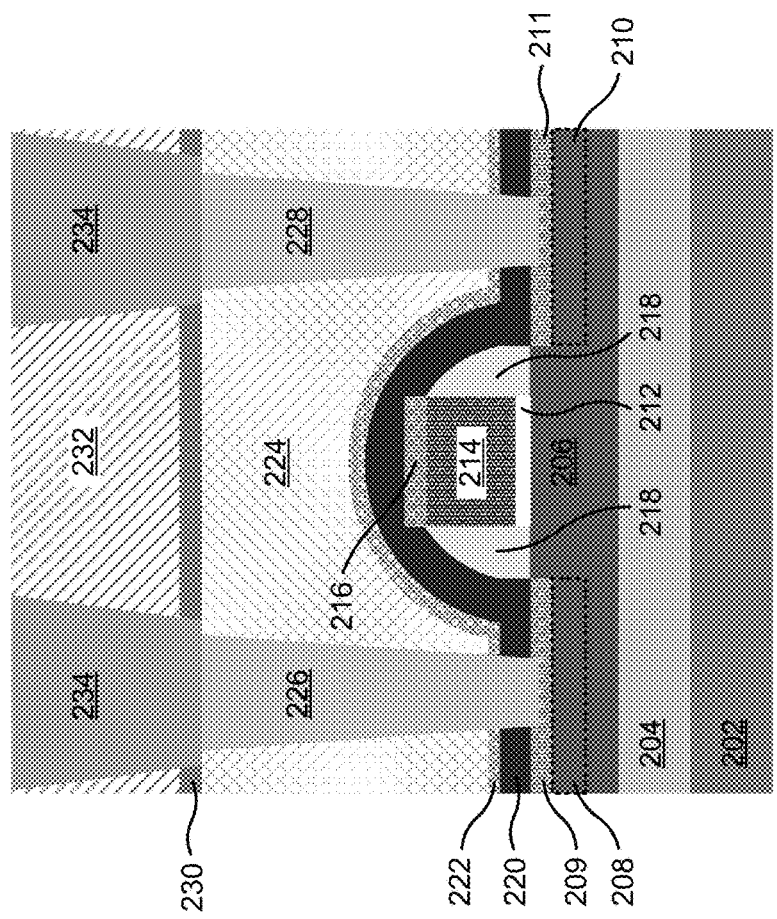
Figure 3K:
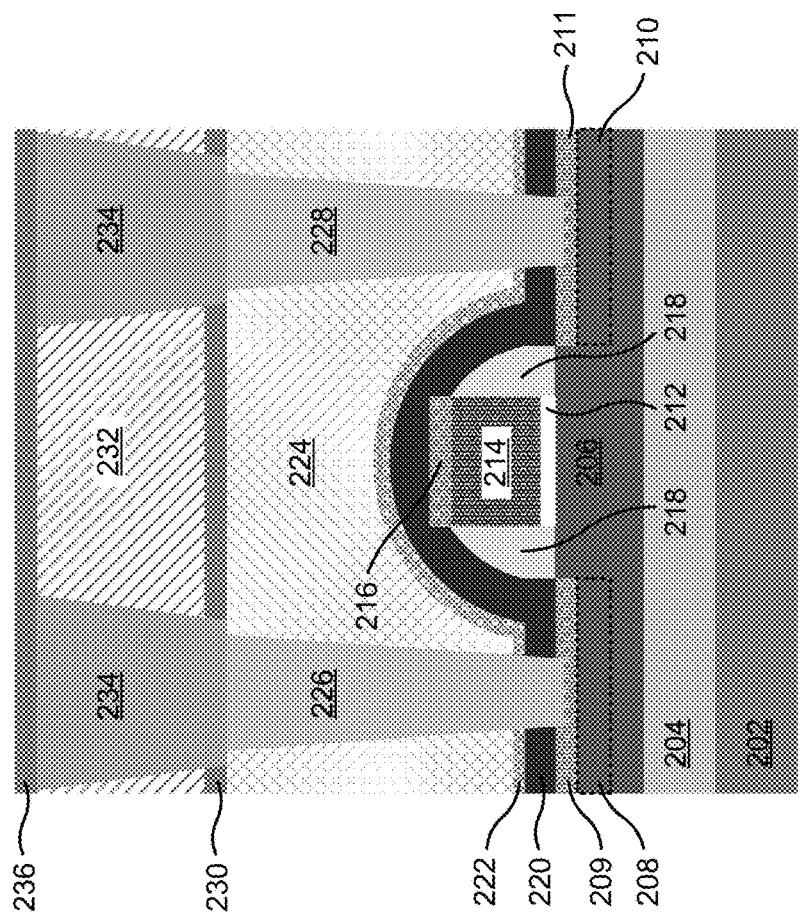
Figure 3L:
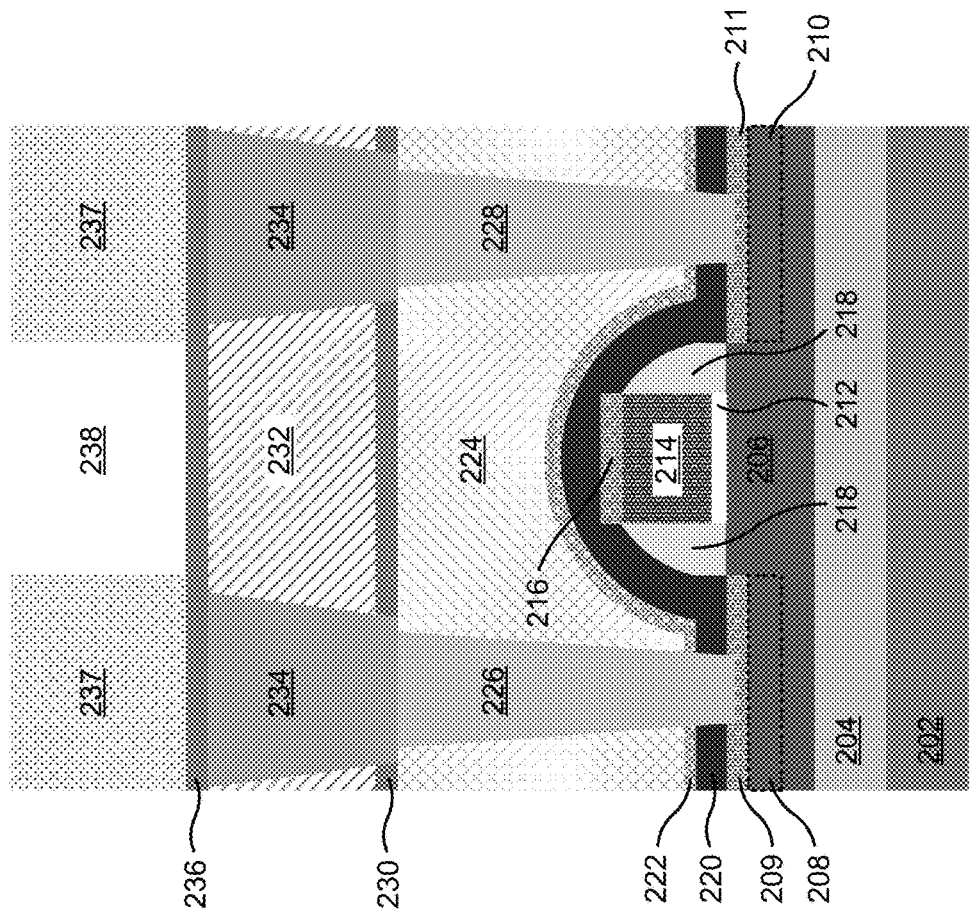
Figure 3M:
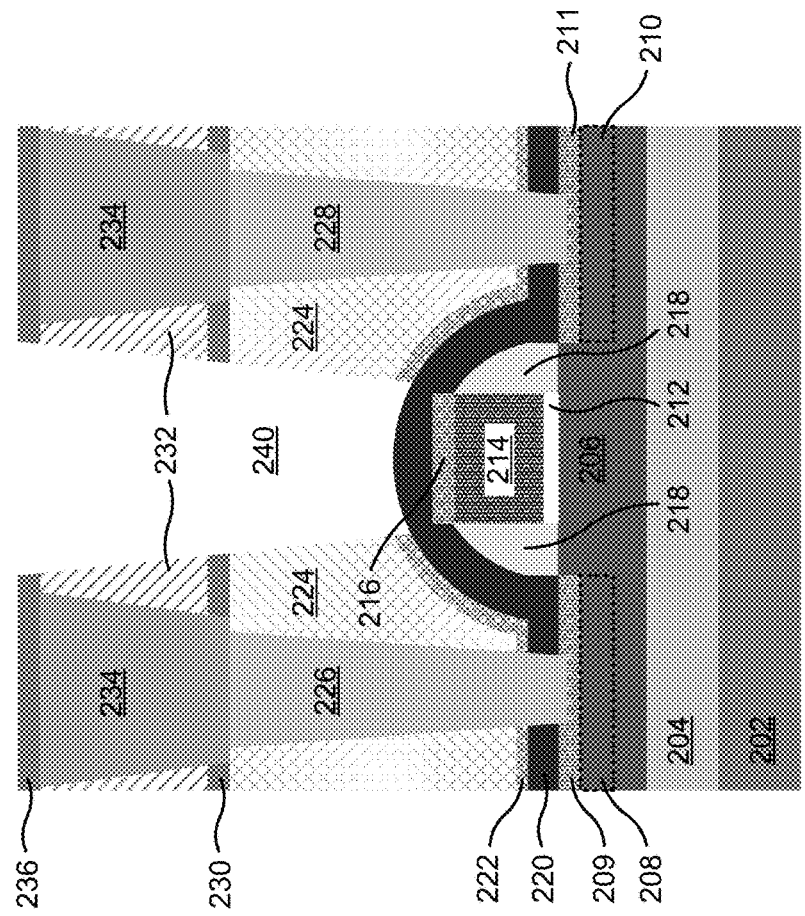
Figure 3N:
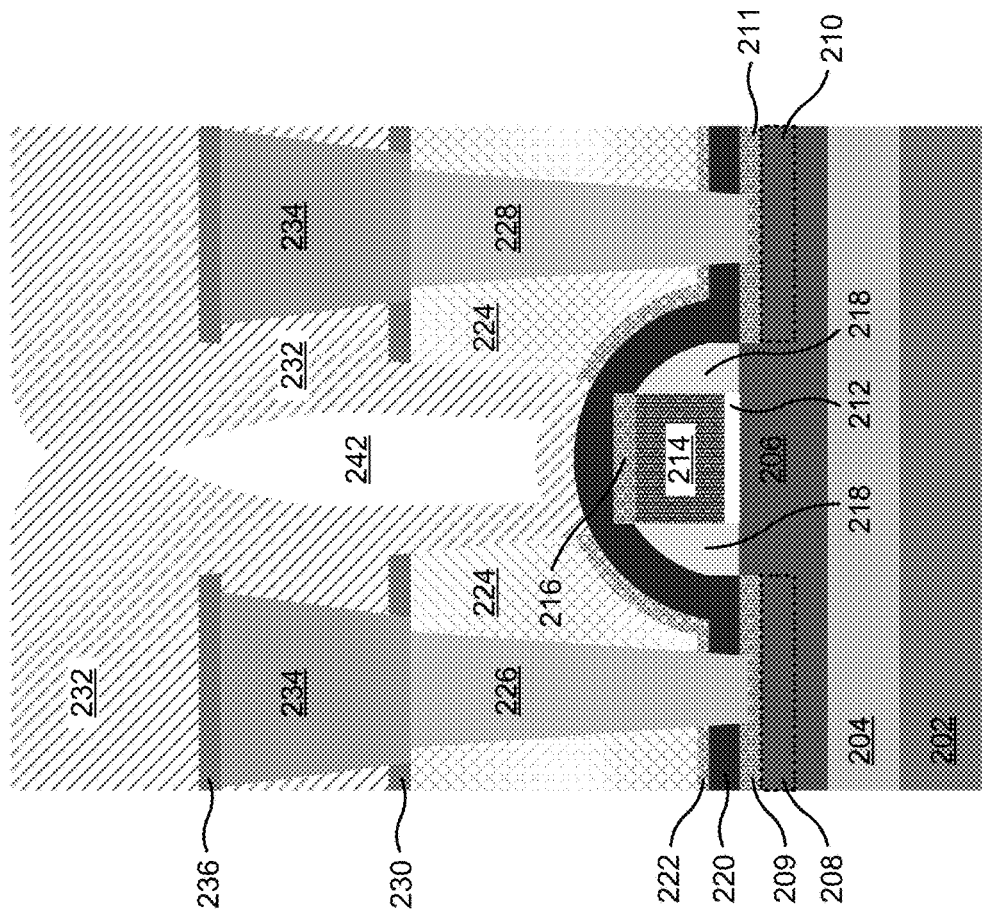
Figure 3O:
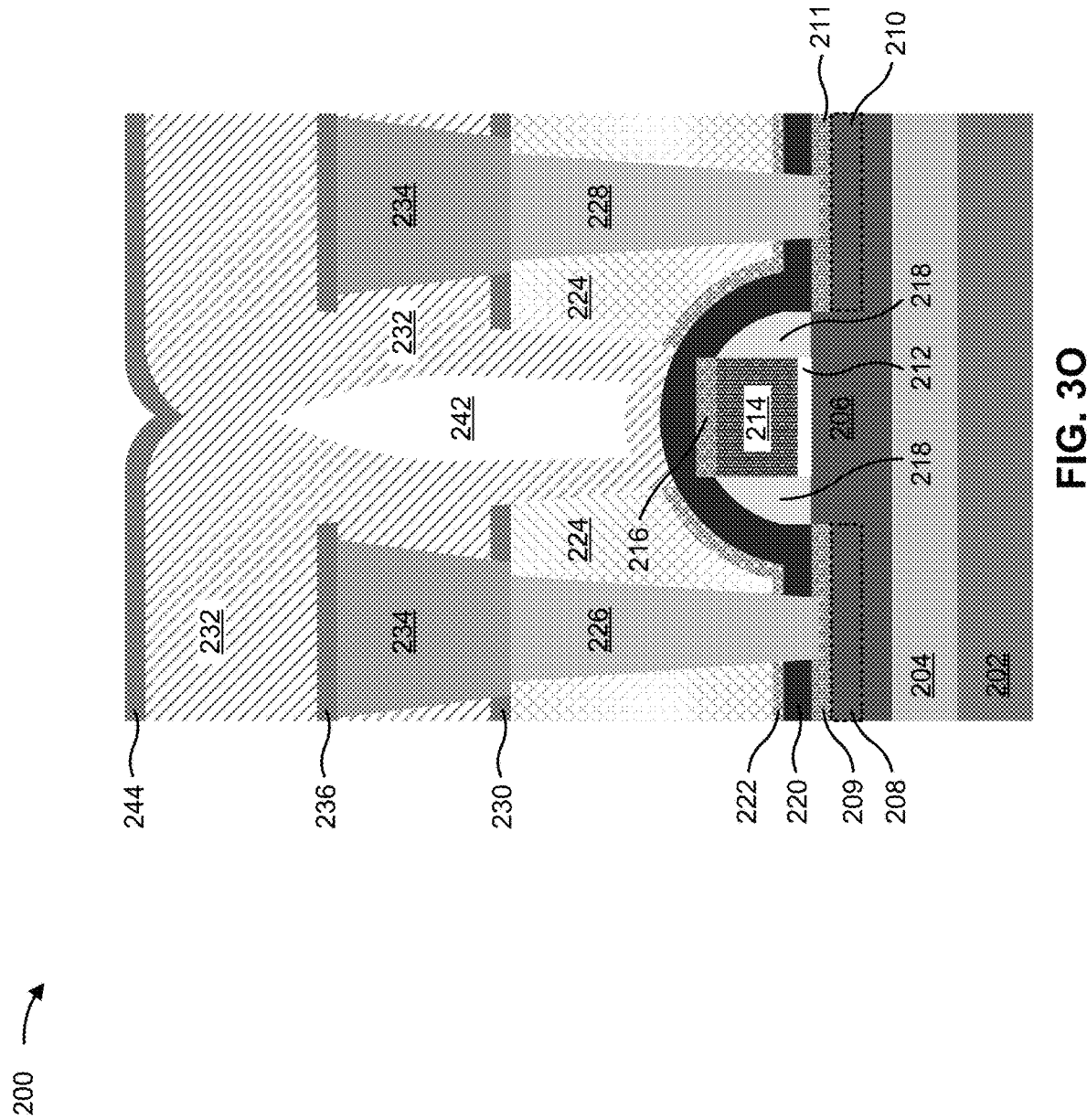
Figure 3P:
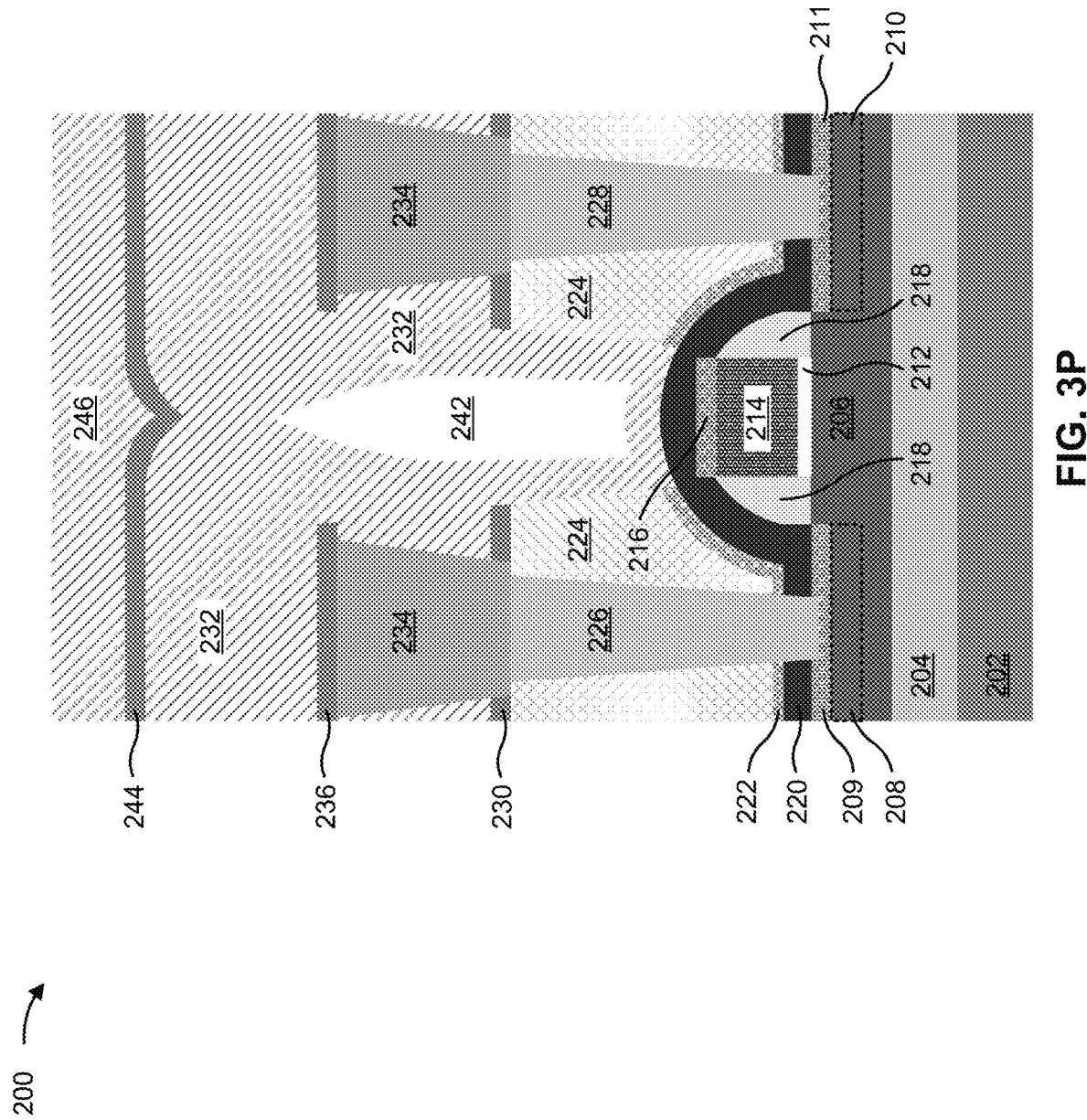
Figure 3Q:
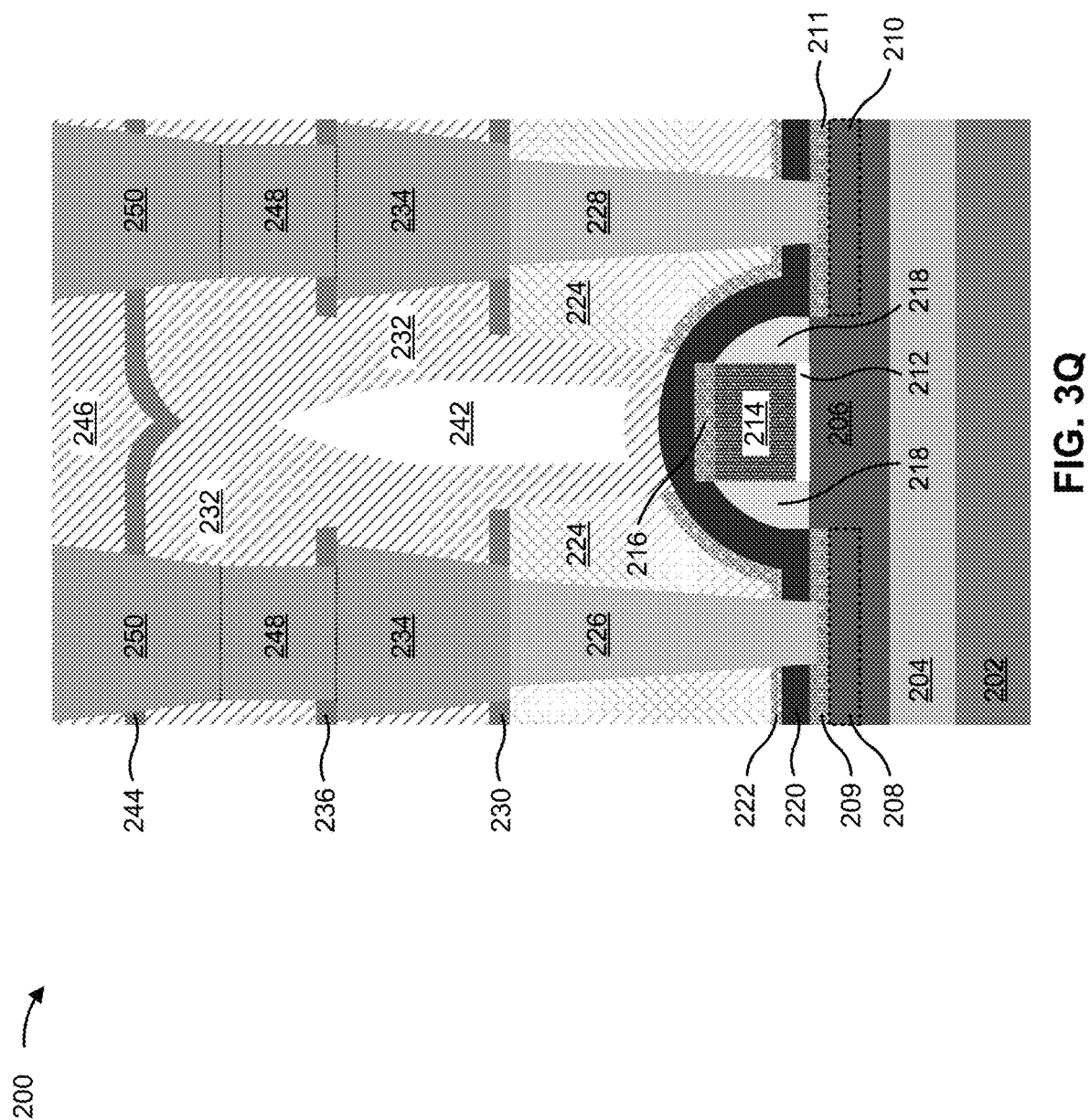

FIGS. 3A-3Q are diagrams of an example of forming semiconductor device 200 of FIGS. 2A-2C. In some implementations, the one or more semiconductor processing tools 102-114 may perform one or more of the techniques and/or processes described in connection with FIGS. 3A-3Q. In some implementations, one or more of the techniques and/or processes described in connection with FIGS. 3A-3Q may be performed by other semiconductor processing tools.

As shown in FIG. 3A, a semiconductor structure (e.g., a MOSFET structure) including the gate 214, the source 208 on a first side of the gate 214, and the drain 210 on a second side of the gate 214 is formed on the substrate 202. For example, the BOX layer may be formed on the substrate 202, after which the active region 206, the source 208, and the drain 210 may be formed. Next, the gate dielectric 212 may be formed, and the gate 214 may be formed on the gate dielectric 212. The spacers 218 may be formed to surround the gate 214 and the gate dielectric 212, after which the source silicide 209, the drain silicide 211, and the gate silicide 216 may be formed. In some implementations, one or more of the semiconductor processing tools 102-114 may form the MOSFET structure shown in FIG. 3A. As noted above, the MOSFET structure of the semiconductor device 200 is provided as an example, and other structures are possible.

As shown in FIG. 3B, the contact etch stop layer 220 may be formed over the MOSFET structure. For example, the deposition tool 102 may deposit the contact etch stop layer 220 over the MOSFET structure using a CVD process, a PVD process, an ALD process, or another type of deposition process.

As shown in FIG. 3C, the dielectric film 222 layer may be formed on the contact etch stop layer 220 layer. For example, the deposition tool 102 may deposit the dielectric film 222 on the contact etch stop layer 220 using a CVD process, a PVD process, an ALD process, or another type of deposition process.

As shown in FIG. 3D, the first dielectric material 224 may be formed over the dielectric film 222. For example, the deposition tool 102 may deposit the first dielectric material 224 over the dielectric film 222 using a CVD process, a PVD process, an ALD process, or another type of deposition process.

As shown in FIG. 3E, a first trench 225 and a second trench 227 may be etched in the first dielectric material 224. In some implementations, as shown, the first trench 225 and the second trench 227 may extend through the dielectric film 222 and the contact etch stop layer 220. In some implementations, the contact etch stop layer 220 serves to indicate an etch endpoint associated with etching the first trench 225 and the second trench 227. In some implementations, to form the first trench 225 and the second trench 227, the deposition tool 102 may deposit a photoresist layer on the first dielectric material 224 (e.g., by a spin coating operation). The exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. The etching tool 108 may etch the first dielectric material 224 based on the pattern formed in the photoresist layer to form the first trench 225 and the second trench 227. For example, the etching tool 108 may perform a wet etching technique (e.g., where the first dielectric material 224 is exposed or submerged in a chemical that etches or removes material at a particular etch rate), a dry etching device (e.g., where a plasma is used to sputter material), or another type of etching technique. The remaining portions of the photoresist layer may be removed after the first dielectric material 224 is etched to form the first trench 225 and the second trench 227.

As shown in FIG. 3F, the first contact 226 and the second contact 228 may be formed. For example, the deposition tool 102 may deposit a metal material (e.g., copper) in the first trench 225 and the second trench 227 (to form the first contact 226 and the second contact 228, respectively) using a CVD process, a PVD process, an ALD process, or another type of deposition process.

As shown in FIG. 3G, the first dielectric layer 230 may be formed. For example, the deposition tool 102 may deposit the first dielectric layer 230 over the first dielectric material 224, the first contact 226, and the second contact 228, using a CVD process, a PVD process, an ALD process, or another type of deposition process.

As shown in FIG. 3H, a first portion of the second dielectric material 232 may be formed. For example, the deposition tool 102 may deposit the first portion of the second dielectric material 232 over the first dielectric layer 230 using a CVD process, a PVD process, an ALD process, or another type of deposition process.

As shown in FIG. 3I, trenches 233 may be etched in the first portion of the second dielectric material 232. In some implementations, as shown, the trenches 233 may extend through the first portion of the second dielectric material 232 and the first dielectric layer 230. In some implementations, to form the trenches 233, the deposition tool 102 may deposit a photoresist layer on the first portion of the second dielectric material 232 (e.g., by a spin coating operation). The exposure tool 104 may form a pattern in the photoresist layer by exposing the photoresist layer to a radiation source, such as a UV source (e.g., a deep UV light source, an EUV light source, and/or the like), an x-ray source, or an e-beam source, to transfer the pattern from a photomask to the photoresist layer. The developer tool 106 may perform a development operation that includes one or more techniques to develop the pattern in the photoresist layer. The etching tool 108 may etch the first portion of the second dielectric material 232 and the first dielectric layer 230 based on the pattern formed in the photoresist layer to form the trenches 233. For example, the etching tool 108 may perform a wet etching technique (e.g., where the first dielectric material 224 is exposed or submerged in a chemical that etches or removes material at a particular etch rate), a dry etching device (e.g., where a plasma is used to sputter material), or another type of etching technique. The remaining portions of the photoresist layer may be removed after the first portion of the second dielectric material 232 is etched to form the trenches 233.

As shown in FIG. 3J, the first metal layer 234 may be formed. For example, the deposition tool 102 may deposit a metal material (e.g., copper) in the trenches 233 (to form connections to the first contact 226 and the second contact 228) using a CVD process, a PVD process, an ALD process, or another type of deposition process.

As shown in FIG. 3K, the second dielectric layer 236 may be formed. For example, the deposition tool 102 may deposit the second dielectric layer 236 over the first metal layer 234 and the first portion of the second dielectric material 232 using a CVD process, a PVD process, an ALD process, or another type of deposition process.

As shown in FIG. 3L, a pattern in a photoresist layer associated with etching an air gap trench 240 may be formed. For example, the deposition tool 102 may deposit a photoresist layer 237 on the second dielectric layer 236 (e.g., by a spin coating operation). The exposure tool 104 may form a pattern in the photoresist layer 237 by exposing the photoresist layer to a radiation source, such as a UV source (e.g., a deep UV light source, an EUV light source, and/or the like), an x-ray source, or an e-beam source, to transfer the pattern from a photomask to the photoresist layer. The developer tool 106 may perform a development operation that includes one or more techniques to develop the pattern in the photoresist layer 237. As shown in FIG. 3L, the photoresist layer 237 is patterned so as to include an opening 238 over the gate 214 of the semiconductor device 200.

As shown in FIG. 3M, the air gap trench 240 is etched based on the patterned photoresist layer 237. In some implementations, as shown, the air gap trench 240 extends through the second dielectric layer 236, the first portion of the second dielectric material 232, the first dielectric layer 230, the first dielectric material 224, and the dielectric film 222 (e.g., such that an opening is present in the dielectric film 222). In some implementations, the etching tool 108 may perform a wet etching technique, a dry etching device, or another type of etching technique in association with forming the air gap trench 240. The remaining portions of the photoresist layer 237 may be removed after the second dielectric layer 236, the first portion of the second dielectric material 232, the first dielectric layer 230, the first dielectric material 224, and the dielectric film 222 are etched to form the air gap trench 240. In some implementations, a sidewall of the air gap trench may have an angle in a range from approximately 70 degrees to approximately 110 degrees relative to a surface of the substrate 202.

As shown in FIG. 3N, a second portion of the second dielectric material 232 may be deposited. For example, the deposition tool 102 may deposit the second portion of the second dielectric material 232 over the second dielectric layer 236 and the air gap trench 240 using a CVD process, a PVD process, an ALD process, or another type of deposition process.

In some implementations, as shown in FIG. 3N, the second portion of the second dielectric material 232 is deposited such that the second portion of the second dielectric material 232 at least partially fills the air gap trench 240. In some implementations, the second portion of the second dielectric material 232 is deposited such that the air gap 242 is formed in the air gap trench 240 (e.g., between at least the first contact 226 and the second contact 228). In some implementations, to form the air gap 242 (rather than filling the air gap trench 240 entirely with the second portion of the second dielectric material 232) a deposition rate of the second portion of the second dielectric material 232 is controlled so as to cause the second dielectric material 232 to close nearer to a top of the air gap trench 240 before the air gap trench 240 is entirely filled with the second portion of the second dielectric material 232. In this way, the second portion of the second dielectric material 232 can be deposited such that the region between the first contact 226 and the second contact 228 comprises the first dielectric material 224 and the second dielectric material 232. In some implementations, the deposition rate may be based on a size and/or a shape of the air gap 242 to be formed in semiconductor device 200. In some implementations, as shown in FIG. 3N, the second portion of the second dielectric material 232 may have a divot in a top surface (e.g., due to some of the second portion of the second dielectric material 232 at least partially filling the air gap trench 240).

As shown in FIG. 3O, the third dielectric layer 244 may be formed. For example, the deposition tool 102 may deposit the third dielectric layer 244 over the second portion of the second dielectric material 232 using a CVD process, a PVD process, an ALD process, or another type of deposition process. As shown, the third dielectric layer 244 may have a pinched feature above the air gap 242 (e.g., caused by the divot in the second portion of the second dielectric material 232).

As shown in FIG. 3P, the third dielectric material 246 may be formed. For example, the deposition tool 102 may deposit the third dielectric material 246 over the third dielectric layer 244 using a CVD process, a PVD process, an ALD process, or another type of deposition process.

As shown in FIG. 3Q, the vias 248 and the second metal layer 250 may be formed. For example, trenches extending through the third dielectric material 246, the third dielectric layer 244, the second dielectric material 232, and the second dielectric layer 236 may be etched, and these trenches may be filled with one or more metal materials to form the vias 248 and the second metal layer 250. In some implementations, the deposition tool 102 may deposit a photoresist layer on the third dielectric material 246 (e.g., by a spin coating operation). The exposure tool 104 may form a pattern in the photoresist layer by exposing the photoresist layer to a radiation source, such as a UV source (e.g., a deep UV light source, an EUV light source, and/or the like), an x-ray source, or an e-beam source, to transfer the pattern from a photomask to the photoresist layer. The developer tool 106 may perform a development operation that includes one or more techniques to develop the pattern in the photoresist layer. The etching tool 108 may (e.g., using a wet etching technique, a dry etching technique, or the like) etch the third dielectric material 246, the third dielectric layer 244, the second dielectric material 232, and the second dielectric layer 236 based on the pattern formed in the photoresist layer to form the trenches. The remaining portions of the photoresist layer may be removed after the etching, and the deposition tool 102 may deposit the one or more metal materials to form the vias 248 and the second metal layer 250.

As indicated above, FIGS. 3A-3Q are provided as an example. Other examples may differ from what is described with regard to FIGS. 3A-3Q. For example, in the process illustrated by FIGS. 3A-3Q, the air gap 242 is formed after the formation of the first metal layer 234 and prior to formation of the second metal layer 250. In another example, the air gap 242 may be formed after formation of the second metal layer 250 and prior to formation of a third metal layer (e.g., when the air gap 242 is to be formed such that the air gap 242 is between portions of the second metal layer 250). In such a case, the formation of the photoresist layer 237, etching of the air gap trench 240, and deposition of the second portion of the second dielectric material 232 may take place after formation of the second metal layer 250 and prior to the formation of the third metal layer. In general, formation of the air gap 242 may be performed after the layer below which the air gap 242 is desired to be present.

Figure 4A:
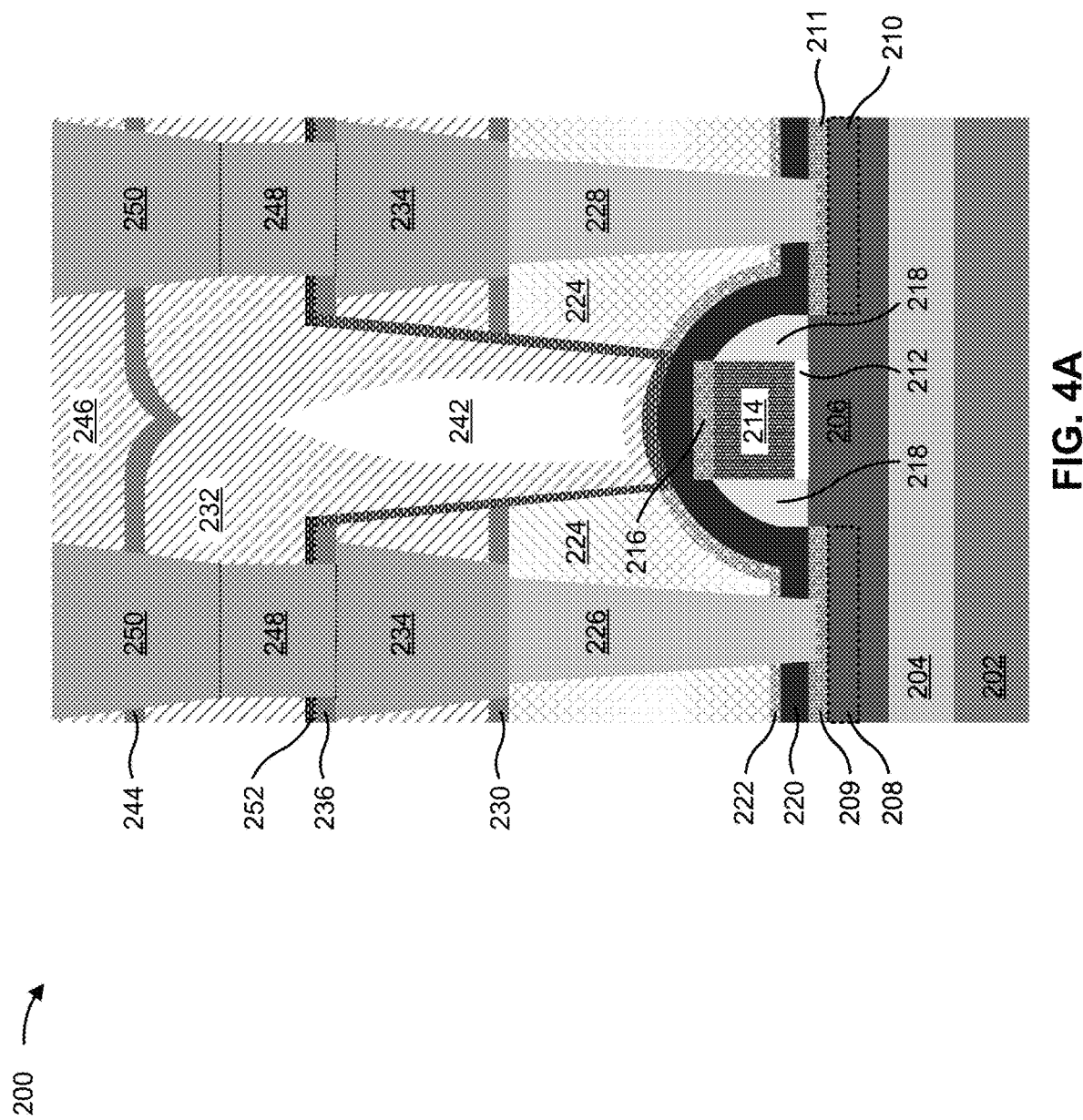

FIGS. 4A-4E are diagrams of further example semiconductor devices 200. FIG. 4A is a diagram of an example semiconductor device 200 that further includes a liner layer 252. In some implementations, the liner layer 252 may serve to provide insulation for regions of the semiconductor device 200. Additionally, or alternatively, the liner layer 252 may improve structural integrity of the semiconductor device 200. In some implementations, the liner layer 252 may comprise, for example, SiN, SiC, an ILD (e.g., the same dielectric material as the first dielectric material 224), an AVID (e.g., the same dielectric material as the second dielectric material 232), or some combination thereof. In some implementations, as shown in FIG. 4A, the liner layer 252 may be between the air gap 242 and the gate 214. In some implementations, the liner layer 252 may be formed after etching of the air gap trench 240 and prior to the deposition of the second portion of the second dielectric material 232. In some implementations, the liner layer 252 may contact the contact etch stop layer 220 over the gate 214 (e.g., the liner layer 252 may be present in the opening the dielectric film 222).

Figure 4C:
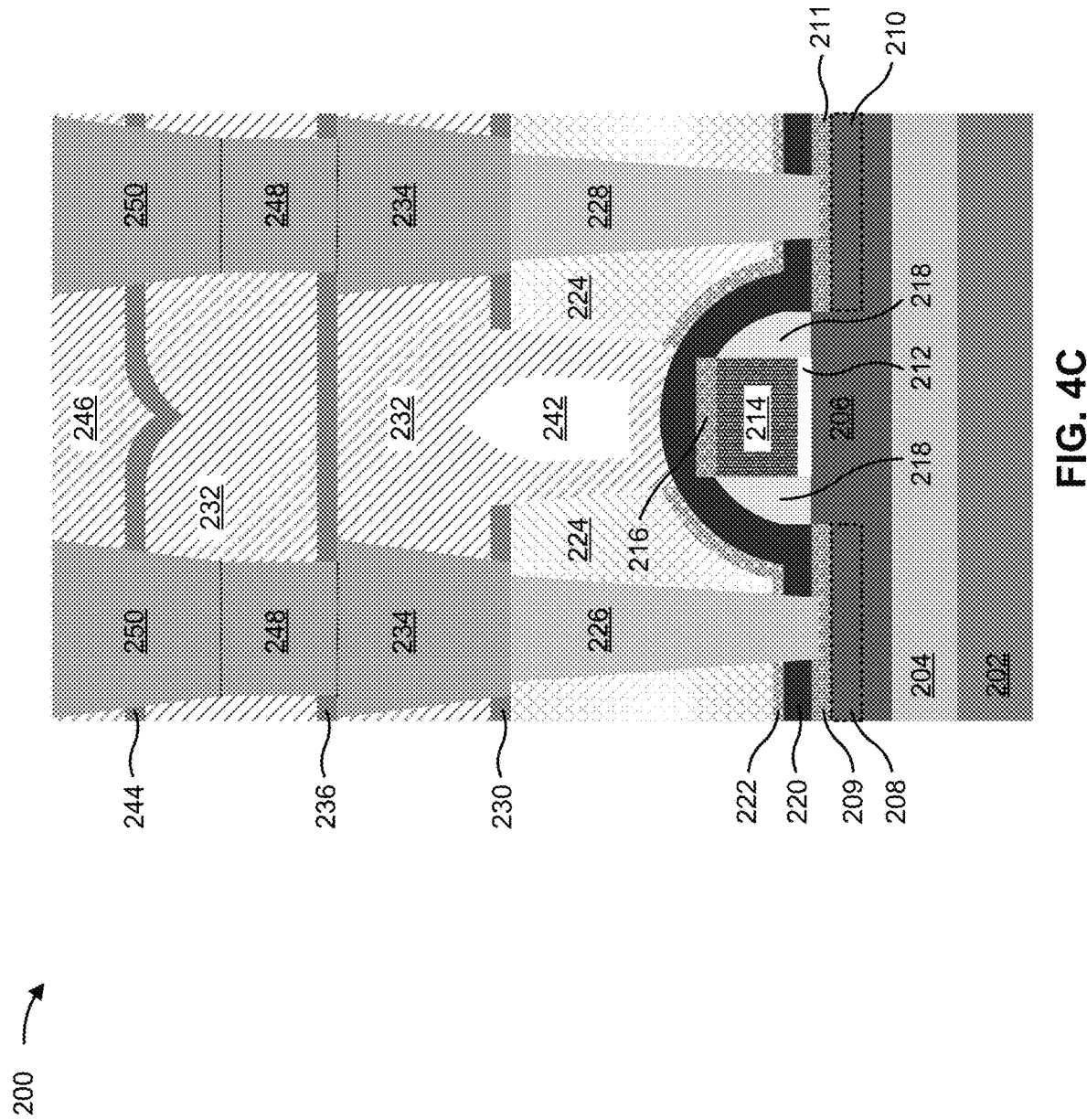

FIGS. 4B and 4C are diagrams of example semiconductor devices 200 including differently sized air gaps 242. In FIG. 4B, the air gap 242 is comparatively thinner than that shown in the semiconductor device 200 of FIG. 2A. In some implementations, such a comparatively thinner air gap 242 may be formed when the air gap trench 240 is dry etched. In FIG. 4C, the air gap 242 is comparatively shorter than the air gap 242 shown in the semiconductor device 200 of FIG. 2A. As shown by the example semiconductor device 200 in FIG. 4C, the air gap 242 may in some implementations be substantially between only the first contact 226 and the second contact 228. Notably, in this example, the second dielectric layer 236 does not include an opening over the gate 214.

Figure 4D:
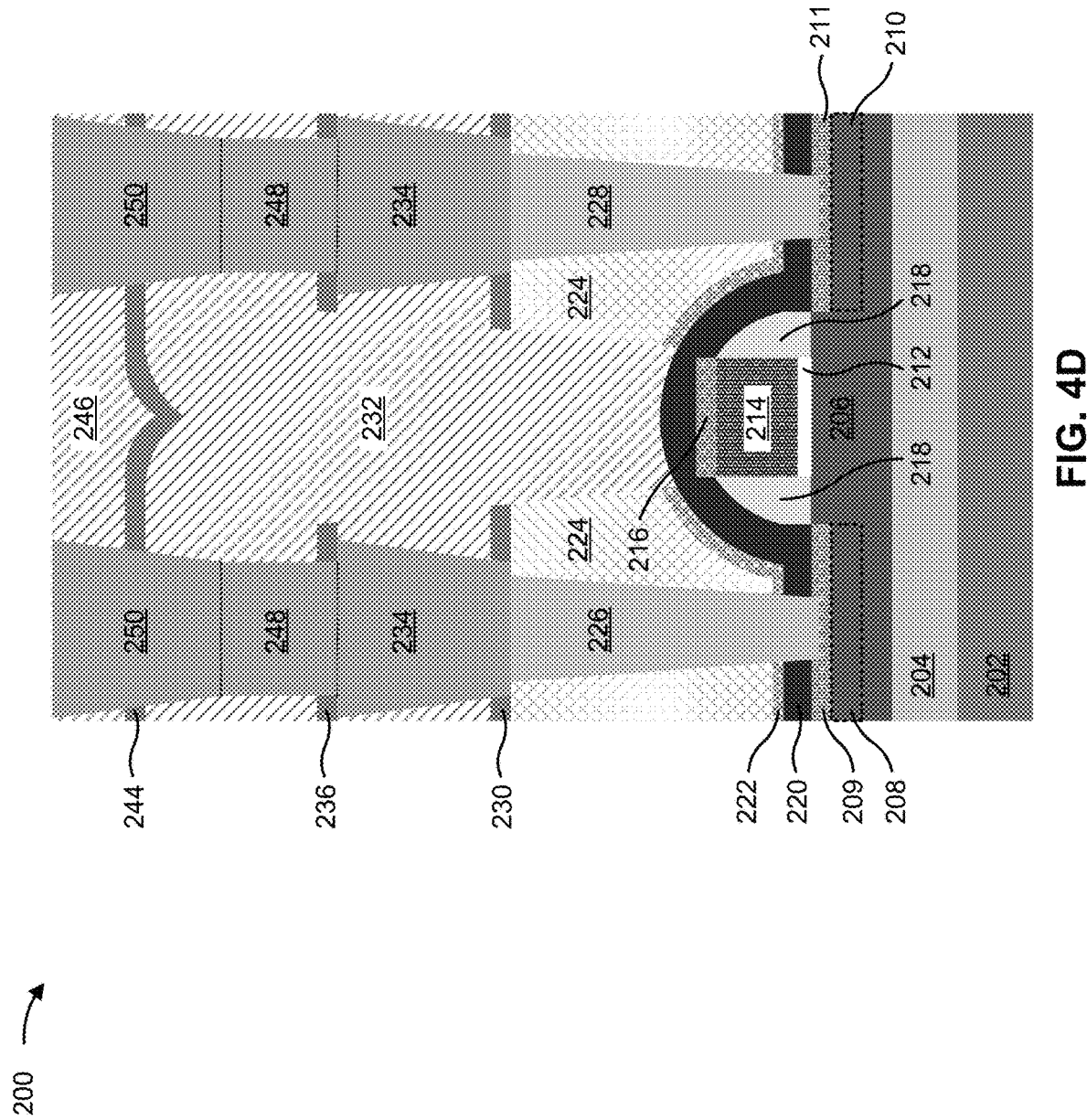
Figure 4E:
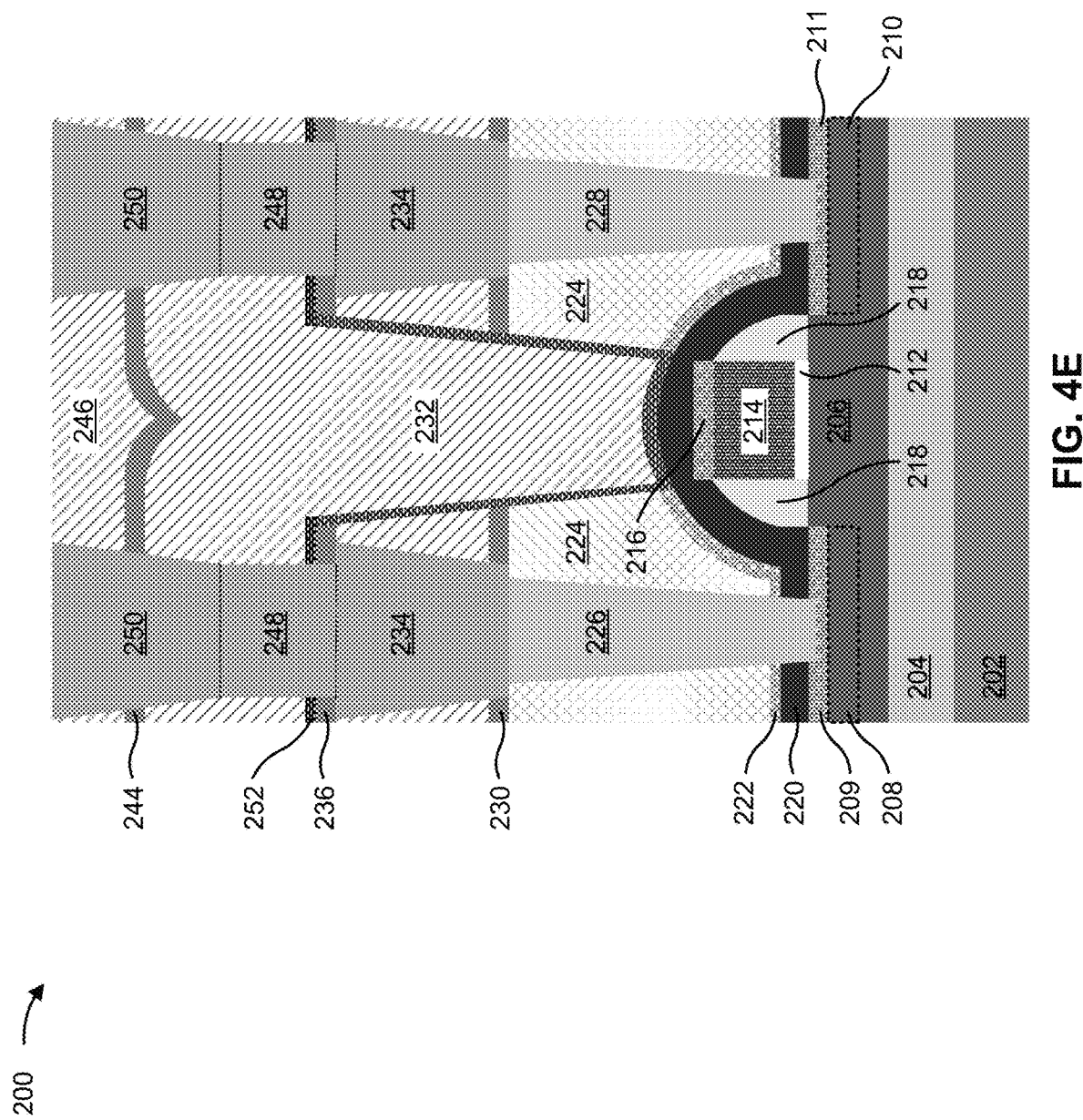

FIGS. 4D and 4E are diagrams illustrating example semiconductor devices 200 that do not include the air gap 242. FIG. 4D illustrates an example implementation of semiconductor device 200 that does not include the air gap 242 or the liner layer 252. FIG. 4E illustrates an example implementation of semiconductor device 200 that does not include the air gap 242 or and includes the liner layer 252. In some implementations, such implementations may still serve to reduce the $C_{off}$ of the semiconductor device 200 (even without the air gap 242) since the second dielectric material 232 is still present between the first contact 226 and the second contact 228, and may also improve structural integrity of the semiconductor device 200 (due to the absence of the air gap 242).

The number and arrangement of structures, layers, or the like shown in FIGS. 4A-4E are provided as examples. In practice, a semiconductor device may include additional structures and/or layers; fewer structures and/or layers; different structures and/or layers; and/or differently arranged structures and/or layers than those shown in FIGS. 4A-4E. That is, as indicated above, FIGS. 4A-4E are provided as an example, and other examples may differ from what is described with regard to FIGS. 4A-4E.

Figure 5:
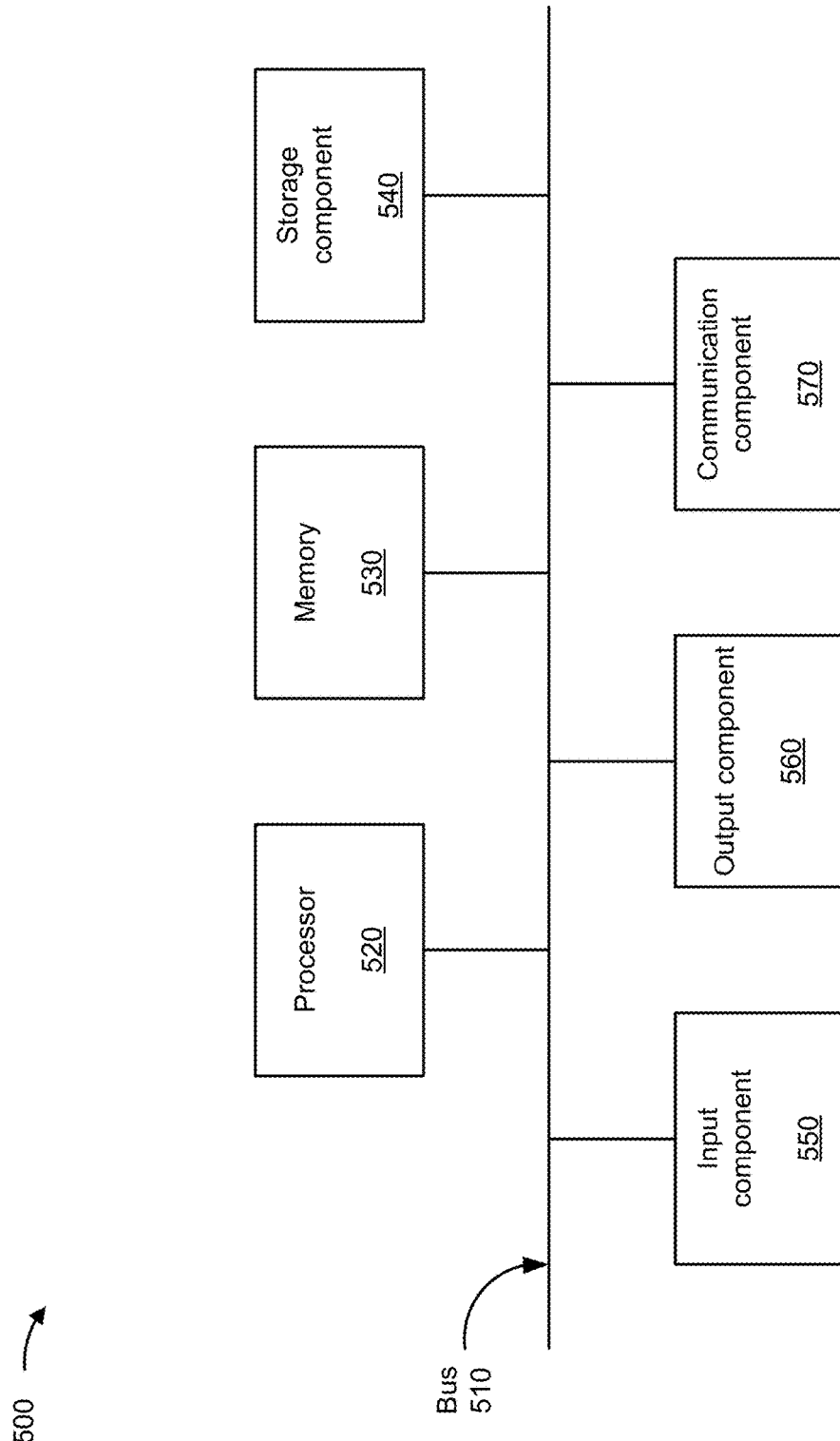
FIG. 5 is a diagram of example components of one or more devices of FIG. 1.

FIG. 5 is a diagram of example components of a device 500, which may correspond to one or more semiconductor processing tools 102-114 and/or wafer/die handling device 116. In some implementations, semiconductor processing tools 102-114 and/or wafer/die handling device 116 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
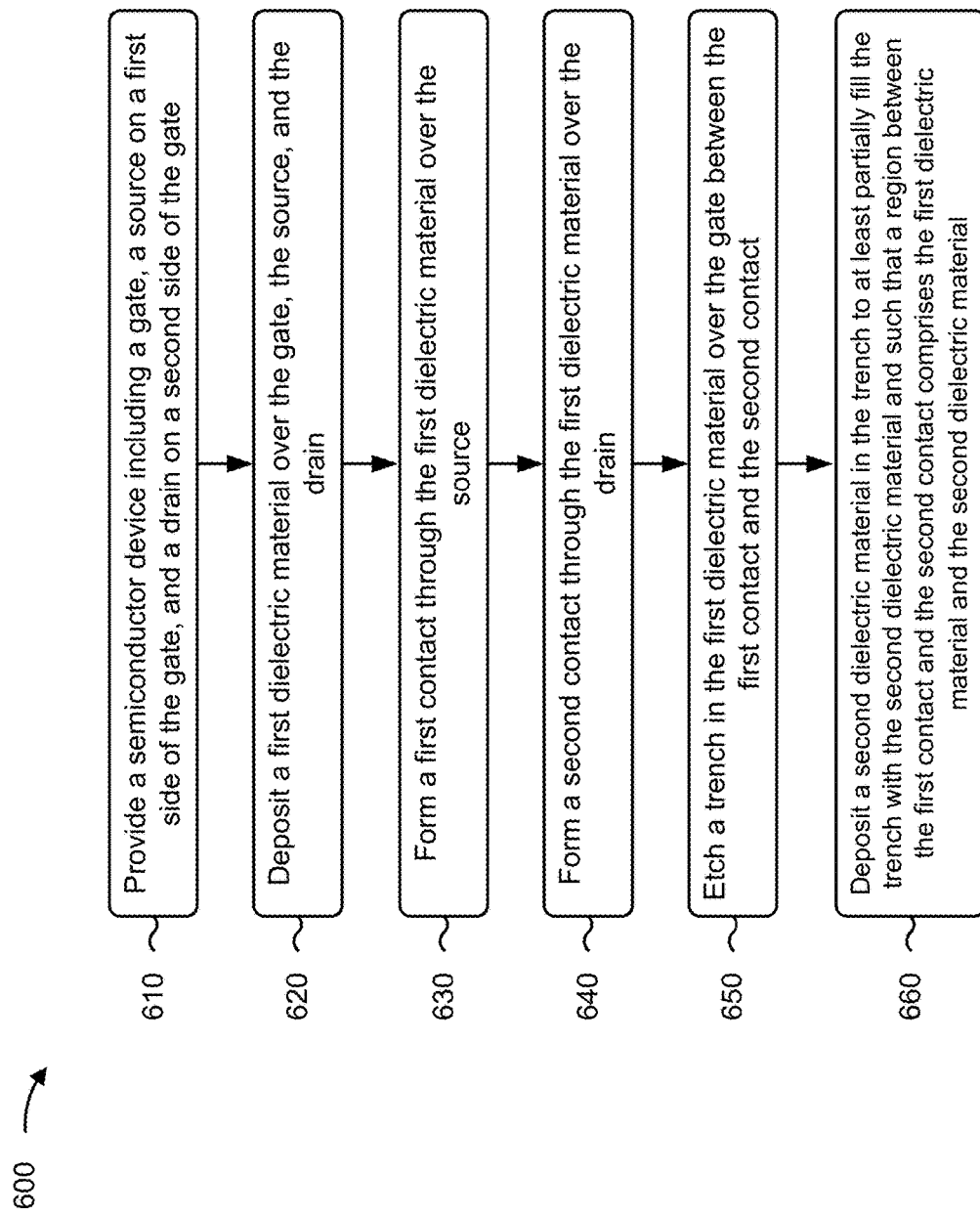
FIG. 6 is a flowchart of an example process relating to forming a semiconductor device described herein.

FIG. 6 is a flowchart of an example process 600 relating to forming a semiconductor device described herein. In some implementations, one or more process blocks of FIG. 6 may be performed by a semiconductor processing tool (e.g., one or more of the semiconductor processing tools 102-114 described above). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include providing a semiconductor device including a gate, a source on a first side of the gate, and a drain on a second side of the gate (block 610). For example, the semiconductor processing tool (e.g., one or more of the semiconductor processing tools 102-114) may provide a semiconductor device 200 including a gate 214, a source 208 on a first side of the gate 214, and a drain 210 on a second side of the gate 214, as described above.

As further shown in FIG. 6, process 600 may include depositing a first dielectric material over the gate, the source, and the drain (block 620). For example, a semiconductor processing tool (e.g., deposition tool 102) may deposit a first dielectric material 224 over the gate 214, the source 208, and the drain 210, as described above.

As further shown in FIG. 6, process 600 may include forming a first contact through the first dielectric material over the source (block 630). For example, one or more semiconductor processing tools (e.g., deposition tool 102, exposure tool 104, developer tool 106, etch tool 108, or the like) may form a first contact 226 through the first dielectric material 224 over the source 208, as described above.

As further shown in FIG. 6, process 600 may include forming a second contact through the first dielectric material over the drain (block 640). For example, one or more semiconductor processing tools (e.g., deposition tool 102, exposure tool 104, developer tool 106, etch tool 108, or the like) may form a second contact 228 through the first dielectric material 224 over the drain 210, as described above.

As further shown in FIG. 6, process 600 may include etching a trench in the first dielectric material over the gate between the first contact and the second contact (block 650). For example, one or more semiconductor processing tools (e.g., deposition tool 102, exposure tool 104, developer tool 106, etch tool 108, or the like) may etch an air gap trench 240 in the first dielectric material 224 over the gate 214 between the first contact 226 and the second contact 228, as described above.

As further shown in FIG. 6, process 600 may include depositing a second dielectric material in the trench to at least partially fill the trench with the second dielectric material and such that a region between the first contact and the second contact comprises the first dielectric material and the second dielectric material (block 660). For example, a semiconductor processing tool (e.g., deposition tool 102) may deposit a second dielectric material 232 in the air gap trench 240 to at least partially fill the air gap trench 240 with the second dielectric material 232 and such that a region between the first contact 226 and the second contact 228 comprises the first dielectric material 224 and the second dielectric material 232, as described above. In some implementations, a dielectric constant of the second dielectric material 232 is less than a dielectric constant of the first dielectric material 224, as described above.

Process 600 may include additional implementations, such as any single implementation or any combination of implementations described below and/or in connection with one or more other processes described elsewhere herein.

In a first implementation, the second dielectric material 232 is deposited such that an air gap 242 is present in the second dielectric material 232 over the gate 214 between the first contact 226 and the second contact 228.

In a second implementation, alone or in combination with the first implementation, process 600 includes forming a metal layer 234 over at least the first contact 226 and the second contact 228, wherein the air gap 242 is between a first portion of the metal layer 234 and a second portion of the metal layer 234, the first portion being over the first contact 226 and the second portion being over the second contact 228.

In a third implementation, alone or in combination with one or more of the first and second implementations, process 600 includes forming a contact etch stop layer 220 over the gate 214 prior to depositing the first dielectric material 224, and forming a dielectric film 222 over the contact etch stop layer 220 prior to depositing the first dielectric material 224, wherein etching the air gap trench 240 forms an opening in the dielectric film 222 over the gate 214.

In a fourth implementation, alone or in combination with one or more of the first through third implementations, process 600 includes forming a dielectric layer 230 over the first dielectric material 224, the dielectric layer 230 being formed prior to etching the air gap trench 240, wherein etching the air gap trench 240 forms an opening in the dielectric layer 230 over the gate 214.

In a fifth implementation, alone or in combination with one or more of the first through fourth implementations, process 600 includes forming a liner layer 252 within the air gap trench 240 prior to depositing the second dielectric material 232.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a semiconductor device (e.g., a MOSFET) may have a reduced $C_{off}$ value and, thus, a reduced $R_{on} \times C_{off}$ value, where the reduction is provided by lowering a dielectric constant in regions between BEOL features of the MOSFET. In some implementations, the lowering of the dielectric constant is provided by including a material with a lower dielectric constant between contacts of the MOSFET and/or by including an air gap between the contacts of the MOSFET and/or between portions of one or more metal layers of the MOSFET, as described above. In some implementations, a $C_{off}$ value associated with the BEOL features can be reduced (e.g., by at least 30%), meaning that an overall $C_{off}$ value of the MOSFET can also be reduced (e.g., by at least 15%). Therefore, the $C_{off}$ value and the $R_{on} \times C_{off}$ value of the MOSFET are decreased, meaning that RC delay is reduced and RF performance is improved. Further, when the MOSFET is used as an amplifier (e.g., an LNA), a Cgd is reduced (e.g., by approximately 20%) and a Cdd is reduced (e.g., by approximately 10%). Furthermore, a maximum gain, an Ft, and/or an Fmax may be improved As described in greater detail above, some implementations described herein provide a semiconductor device. The semiconductor device includes a source on a first side of a gate. The semiconductor device includes a drain on a second side of the gate, the second side of the gate being opposite to the first side of the gate. The semiconductor device includes a first contact over the source. The semiconductor device includes a second contact over the drain. The semiconductor device includes an air gap over the gate between at least the first contact and the second contact. The semiconductor device includes at least two dielectric materials in each of a region between the air gap and the first contact and a region between the air gap and the second contact.

As described in greater detail above, some implementations described herein provide a method. The method includes providing a semiconductor device including a gate, a source on a first side of the gate, and a drain on a second side of the gate. The method includes depositing a first dielectric material over the gate, the source, and the drain. The method includes forming a first contact through the first dielectric material over the source. The method includes forming a second contact through the first dielectric material over the drain. The method includes etching a trench in the first dielectric material over the gate between the first contact and the second contact. The method includes depositing a second dielectric material in the trench to at least partially fill the trench with the second dielectric material and such that a region between the first contact and the second contact comprises the first dielectric material and the second dielectric material, where a dielectric constant of the second dielectric material is less than a dielectric constant of the first dielectric material.

As described in greater detail above, some implementations described herein provide a semiconductor device. The semiconductor device includes a first contact on a first side of a gate. The semiconductor device includes a second contact on a second side of the gate, the second side of the gate being opposite to the first side of the gate. The semiconductor device includes a first dielectric material between the first contact and the second contact, a first portion of the first dielectric material being adjacent to the first contact and a second portion of the first dielectric material being adjacent to the second contact. The semiconductor device includes a second dielectric material between the first portion of the first dielectric material and the second portion of the first dielectric material, the second dielectric material being over the gate, where a dielectric constant of the first dielectric material is greater than a dielectric constant of the second dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a source on a first side of a gate;
   a drain on a second side of the gate, the second side of the gate being opposite to the first side of the gate;
   a first contact over the source;
   a second contact over the drain;
   an air gap over the gate between at least the first contact and the second contact;
   at least two dielectric materials in each of a region between the air gap and the first contact and a region between the air gap and the second contact; and
   a liner layer that is over the first contact and the second contact and that is under the air gap.

2. The semiconductor device of claim 1, further comprising:
   a stop layer over the gate; and a dielectric film over the stop layer, the dielectric film having an opening below the air gap.

3. The semiconductor device of claim 1, wherein the at least two dielectric materials include a first dielectric material and a second dielectric material, wherein the second dielectric material is between the air gap and the first dielectric material in the region between the air gap and the second contact and in the region between the air gap and the second contact.

4. The semiconductor device of claim 3, wherein a dielectric constant of the second dielectric material is less than a dielectric constant of the first dielectric material.

5. The semiconductor device of claim 3, wherein the first dielectric material comprises phosphorous.

6. The semiconductor device of claim 3, wherein the second dielectric material comprises fluorine.

7. The semiconductor device of claim 1, further comprising one or more metal layers, over the first contact and the second contact, comprising a first portion over the first contact and a second portion over the second contact, wherein the air gap is between the first portion and the second portion.

8. The semiconductor device of claim 7, wherein an area of the air gap between the first portion and the second portion is greater than an area of the air gap between the first contact and the second contact.

9. The semiconductor device of claim 1, further comprising one or more dielectric layers, wherein the air gap is between a portion of at least one dielectric layer of the one or more dielectric layers that is on the first side of the gate and a portion of the at least one dielectric layer that is on the second side of the gate.

10. The semiconductor device of claim 1, wherein a size of the air gap nearer to a bottom of the air gap is larger than a size of the air gap nearer to a top of the air gap.

11. The semiconductor device of claim 1, wherein the semiconductor device includes a metal-oxide-semiconductor field-effect transistor (MOSFET).

12. The semiconductor device of claim 1, wherein the liner layer is between two of the at least two dielectric materials.

13. A semiconductor device comprising:
a first contact on a first side of a gate;
a second contact on a second side of the gate;
a first dielectric material, between the first contact and the second contact, comprising a first portion adjacent to the first contact and a second portion adjacent to the second contact;
a second dielectric material between the first portion of the first dielectric material and the second portion of the first dielectric material, the second dielectric material being over the gate,
wherein a dielectric constant of the first dielectric material is greater than a dielectric constant of the second dielectric material; and
a liner layer that is over the first contact and the second contact.

14. The semiconductor device of claim 13, further comprising an air gap between the first contact and the second contact within the second dielectric material.

15. The semiconductor device of claim 14, wherein the first dielectric material and second dielectric material are each in a region between the air gap and the first contact and a region between the air gap and the second contact.

16. The semiconductor device of claim 14, further comprising:
a stop layer over the gate; and
a dielectric film over the stop layer, the dielectric film having an opening below the air gap such that one of the first dielectric material and the second dielectric material is on the stop layer below the air gap.

17. The semiconductor device of claim 14, wherein the first dielectric material is between the air gap and the first dielectric material in a region between the air gap and the first contact, and wherein the second dielectric material is between the air gap and the first dielectric material in the region between the air gap and the second contact.

18. The semiconductor device of claim 14, further comprising one or more metal layers, over the first contact and the second contact, comprising a first portion over the first contact and a second portion over the second contact,
wherein the air gap is between the first portion and the second portion.

19. The semiconductor device of claim 14, further comprising one or more dielectric layers, wherein the air gap is between a first portion of the one or more dielectric layers that is on the first side of the gate and a second portion of the one or more dielectric layers that is on the second side of the gate.

20. A semiconductor device, comprising:
a source and a drain that are each on a gate;
an air gap over the gate between a first contact, over the source, and a second contact over the drain;
a dielectric material in a region between the air gap and the first contact and a region between the air gap and the second contact; and
a liner layer that is over the first contact and the second contact and that is under the air gap.

* * * * *